US012008967B2

(12) United States Patent
Woo et al.

(10) Patent No.: US 12,008,967 B2
(45) Date of Patent: *Jun. 11, 2024

(54) DISPLAY DEVICE

(71) Applicant: SAMSUNG DISPLAY CO., LTD., Yongin-si (KR)

(72) Inventors: Deokhwa Woo, Suwon-si (KR); Jeonkyoo Kim, Seoul (KR); Kuk-Hwan Ahn, Hwaseong-si (KR); Myungwoo Lee, Cheonan-si (KR); Bitna Lee, Yongin-si (KR); Manseung Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/308,070

(22) Filed: Apr. 27, 2023

(65) Prior Publication Data

US 2023/0260465 A1     Aug. 17, 2023

Related U.S. Application Data

(63) Continuation of application No. 17/393,712, filed on Aug. 4, 2021, now Pat. No. 11,670,243.

(30) Foreign Application Priority Data

Nov. 19, 2020    (KR) .................... 10-2020-0155991

(51) Int. Cl.
*G09G 3/3275*     (2016.01)
*H10K 59/121*     (2023.01)
*H10K 59/65*     (2023.01)

(52) U.S. Cl.
CPC ......... *G09G 3/3275* (2013.01); *H10K 59/121* (2023.02); *H10K 59/65* (2023.02);
(Continued)

(58) Field of Classification Search
CPC ...... G09G 3/3275; G09G 3/32; G09G 3/3225; G09G 3/3208; G09G 2300/0452;
(Continued)

(56) References Cited

U.S. PATENT DOCUMENTS 10,276,640 B2    4/2019   Chung et al.
11,294,422 B1 *   4/2022   Srikanth ................ H04N 23/63
(Continued)

FOREIGN PATENT DOCUMENTS

KR         10-0543009       1/2006
KR    10-2017-0029041       3/2017
(Continued)

*Primary Examiner* — David Tung
(74) *Attorney, Agent, or Firm* — F. CHAU & ASSOCIATES, LLC

(57) ABSTRACT

A display device includes a display panel with a first display area having a first light transmittance and a second display area having a second light transmittance higher than the first light transmittance. The display device also includes a driving controller which divides an image signal into a first image signal corresponding to a first pixel unit in the first display area and a second image signal corresponding to a second pixel unit and a non-pixel unit adjacent to the second pixel unit. The display controller calculates the second image signal with a preset kernel matrix, and outputs a data signal corresponding to the second pixel unit in the second display area.

19 Claims, 23 Drawing Sheets

(52) U.S. Cl.
CPC ............ *G09G 2300/0452* (2013.01); *G09G 2300/0842* (2013.01); *G09G 2320/0646* (2013.01); *G09G 2320/0673* (2013.01); *G09G 2360/16* (2013.01)

(58) Field of Classification Search
CPC ... G09G 2300/0842; G09G 2320/0646; G09G 2320/0673; G09G 2320/0276; G09G 2320/02; G09G 2360/14; G09G 2360/16; H01L 27/3234; H01L 27/326; H10K 59/121; H10K 59/65
See application file for complete search history.

(56) References Cited

U.S. PATENT DOCUMENTS

| | | |
|---|---|---|
| 2013/0215360 A1 | 8/2013 | Pollack et al. |
| 2019/0333452 A1 | 10/2019 | Kim et al. |
| 2020/0195764 A1 | 6/2020 | Xu et al. |
| 2021/0065625 A1 | 3/2021 | Wang et al. |
| 2022/0157258 A1 | 5/2022 | Woo et al. |

FOREIGN PATENT DOCUMENTS

| | | |
|---|---|---|
| KR | 10-2019-0125551 | 11/2019 |
| KR | 10-2020-0014408 | 2/2020 |

* cited by examiner

FIG. 7
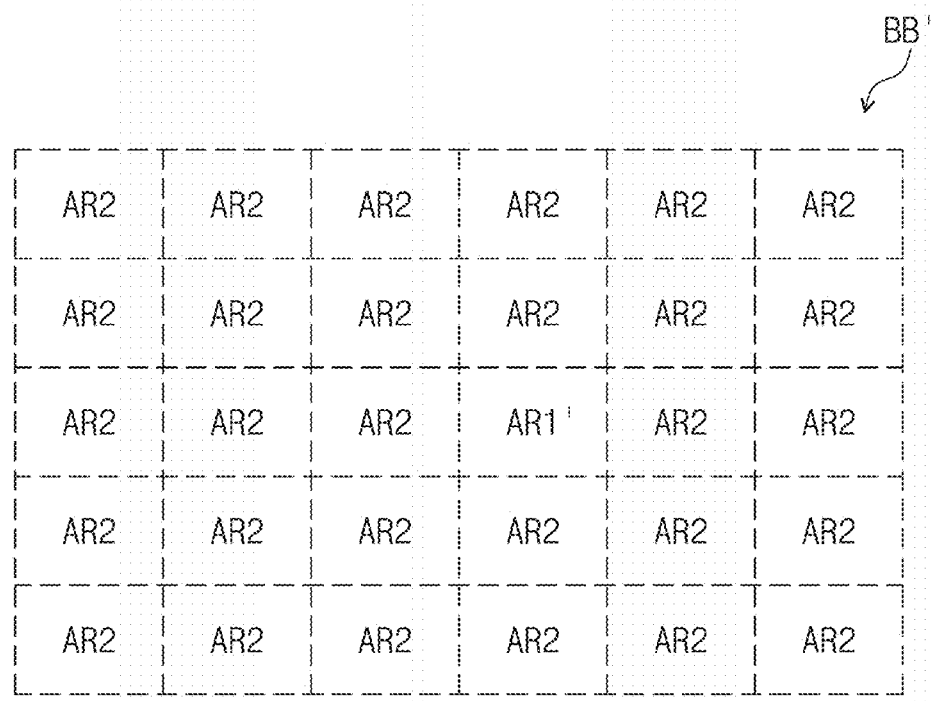
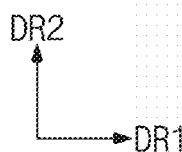

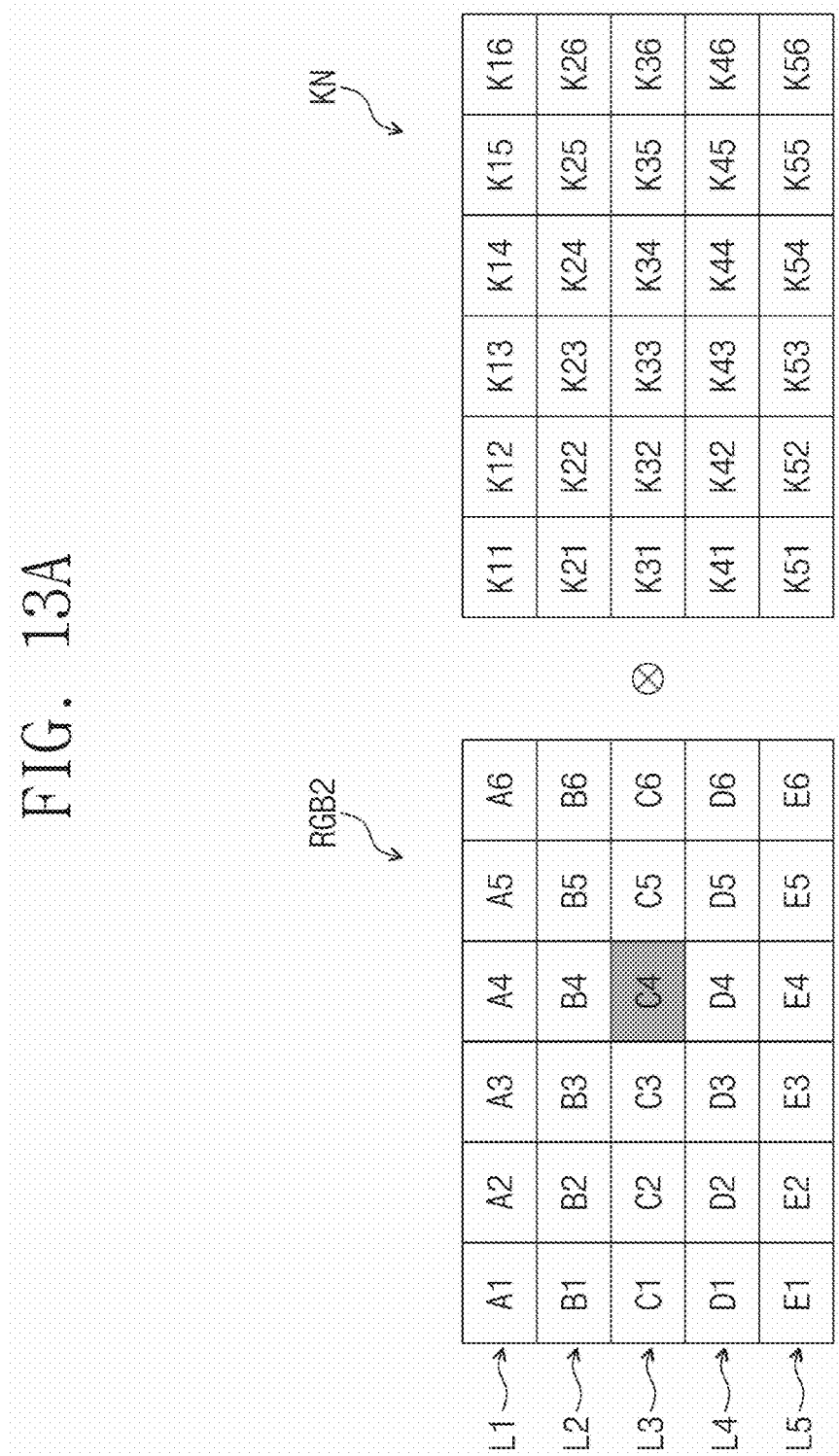

FIG. 14A

|   |   |    |    |    |    |
|---|---|----|----|----|----|
| 0 | 0 | 7  | 7  | 0  | 0  |
| 5 | 15| 15 | 15 | 15 | 5  |
| 10| 15| 19 | 19 | 15 | 10 |
| 5 | 15| 15 | 15 | 15 | 5  |
| 0 | 0 | 7  | 7  | 0  | 0  |

|   |    |    |    |    |    |
|---|----|----|----|----|----|
| 7 | 15 | 17 | 15 | 7  | 1  |
| 3 | 7  | 15 | 17 | 15 | 7  |
| 1 | 3  | 7  | 15 | 17 | 15 |
| 1 | 1  | 3  | 7  | 15 | 17 |
| 1 | 1  | 1  | 3  | 7  | 15 |

KN2

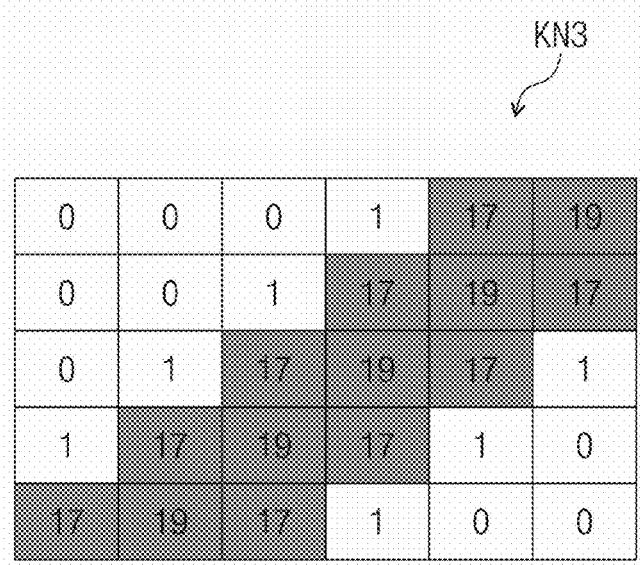

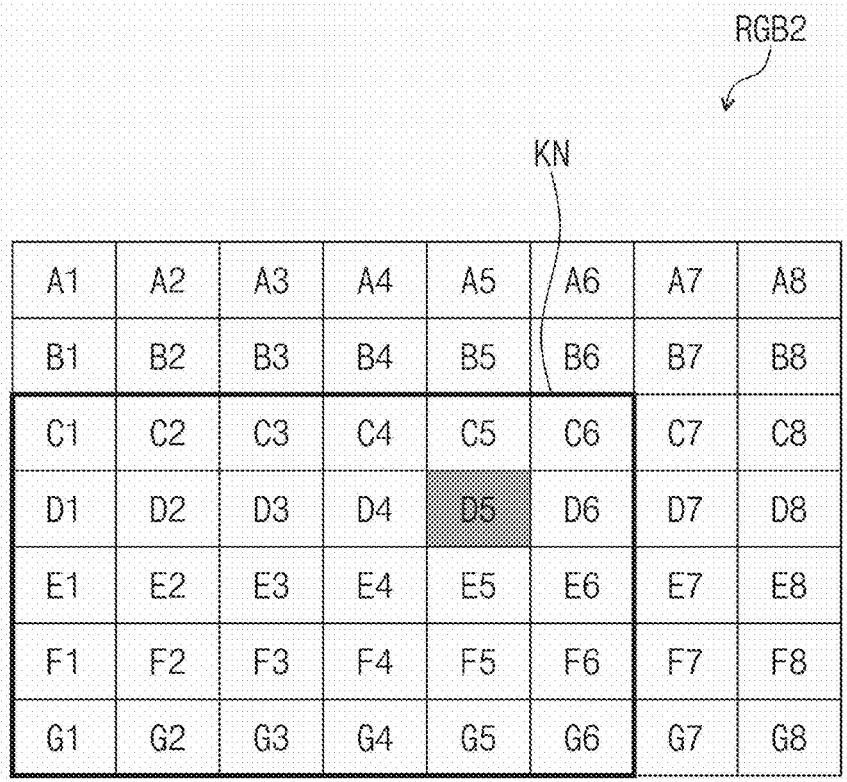

FIG. 16A

RGBb table (5 columns A-E, rows 2-7):
| A7 | B7 | C7 | D7 | E7 |
| A6 | B6 | C6 | D6 | E6 |
| A5 | B5 | C5 | D5 | E5 |
| A4 | B4 | C4 | D4 | E4 |
| A3 | B3 | C3 | D3 | E3 |
| A2 | B2 | C2 | D2 | E2 |

+

RGBa table (5 columns A-E, rows 1-6):
| A6 | B6 | C6 | D6 | E6 |
| A5 | B5 | C5 | D5 | E5 |
| A4 | B4 | C4 | D4 | E4 |
| A3 | B3 | C3 | D3 | E3 |
| A2 | B2 | C2 | D2 | E2 |
| A1 | B1 | C1 | D1 | E1 |

FIG. 16B

| A12 | A23 | A34 | A45 | A56 | A67 |
|-----|-----|-----|-----|-----|-----|
| B12 | B23 | B34 | B45 | B56 | B67 |
| C12 | C23 | C34 | C45 | C56 | C67 |
| D12 | D23 | D34 | D45 | D56 | D67 |
| E12 | E23 | E34 | E45 | E56 | E67 |

RGBc

DISPLAY DEVICE

CROSS-REFERENCE TO RELATED APPLICATIONS

This U.S. non-provisional patent application claims priority under 35 USC § 120 to U.S. patent application Ser. No. 17/393,712, filed on Aug. 4, 2021, and under 35 U.S.C. § 119 to Korean Patent Application No. 10-2020-0155991, filed on Nov. 19, 2020, the entire contents of which are hereby incorporated by reference.

BACKGROUND

1. Field of the Disclosure

One or more embodiments described herein relate to a display device.

2. Background of the Related Art

Display devices have been developed to include infrared sensors, proximity sensors, cameras, and other functional circuits to meet consumer demand. Some of these circuits and their attendant components are disposed in an image display area. The number of pixels in an area overlapping the components of a functional circuit may be reduced to prevent performance degradation of the functional circuit, but this may adversely affect display quality.

SUMMARY

One or more embodiments described herein provide a display device capable of improving display quality of a display area in which an electronic module is disposed.

In accordance with one or more embodiments, a display device includes a display panel including a first display area having a first light transmittance and a second display area having a second light transmittance higher than the first light transmittance; and a driving controller configured to receive an image signal and to output a data signal for the display panel. The driving controller configured to divide the image signal into a first image signal corresponding to a first pixel unit in the first display area of the display panel and a second image signal corresponding to a second pixel unit in the second display area of the display panel and a non-pixel unit adjacent to the second pixel unit, calculate the second image signal with a preset kernel matrix, and output a data signal corresponding to the second pixel unit in the second display area.

In accordance with one or more embodiments, a display device includes an electronic module, a display panel including a first display area non-overlapping the electronic module and a second display area overlapping the electronic module and adjacent to the first display area, and a driving controller configured to receive an image signal and to output a data signal to be provided to the display panel. The driving controller is configured to divide the image signal into a first image signal corresponding to a first pixel unit in the first display area of the display panel and a second image signal corresponding to a second pixel unit in the second display area of the display panel and a non-pixel unit adjacent to the second pixel unit, calculate the second image signal with a preset kernel matrix, and output a data signal corresponding to the pixel unit in the second display area.

In accordance with one or more embodiments, a display device includes a display panel including a first display area having a first light transmittance and a second display area having a second light transmittance higher than the first light transmittance, and a driving controller configured to receive an image signal and to output a data signal to be provided to the display panel. The driving controller includes a gamma converter configured to convert the image signal to a gamma image signal, a memory configured to store the gamma image signal and to output the first image signal corresponding to the first pixel unit in the first display area, and the second image signal corresponding to the second pixel unit and the non-pixel unit in the second display area, a compensator configured to calculate the second image signal with a kernel matrix and output a compensation signal; and mapping logic configured to map the compensation signal to the second pixel unit in the second display area.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 7 illustrates an embodiment of area BB' of FIG. 4;

FIGS. 13A and 13B illustrate embodiments of a second image signal and kernel data provided from a memory;

FIGS. 14A to 14C illustrate examples of kernel matrices;

FIGS. 15A to 15I illustrates examples of a correspondence between a second image signal and a kernel matrix; and FIGS. 16A and 16B illustrates embodiments of operation of a compensator.

DETAILED DESCRIPTION

Figure 1:
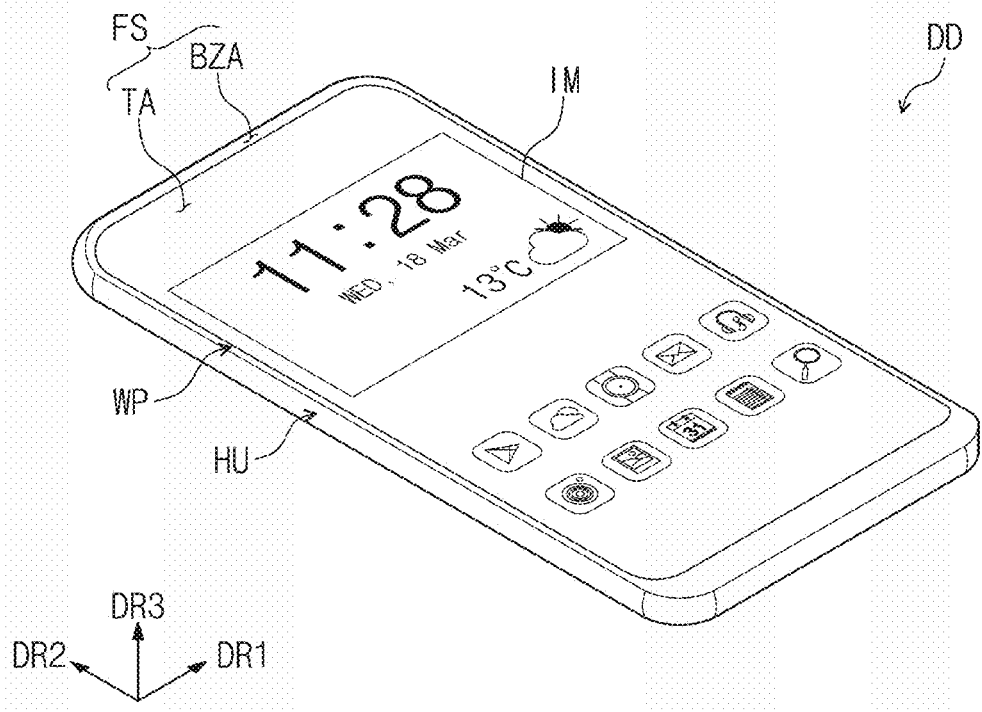
FIG. 1 illustrates an embodiment of a display device.

In this specification, when an element (or region, layer, part, etc.) is referred to as being "on", "connected to", or "coupled to" another element, it means that it can be directly placed on/connected to/coupled to other components, or a third component can be arranged between them. Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing. In embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this present invention belongs. In addition, terms defined in a commonly used dictionary should be interpreted as having a meaning consistent with the meaning in the context of the related technology, and unless interpreted in an ideal or overly formal sense, the terms are explicitly defined herein.

Hereinafter, embodiments of the inventive concept will be described with reference to the drawings.

Figure 2:
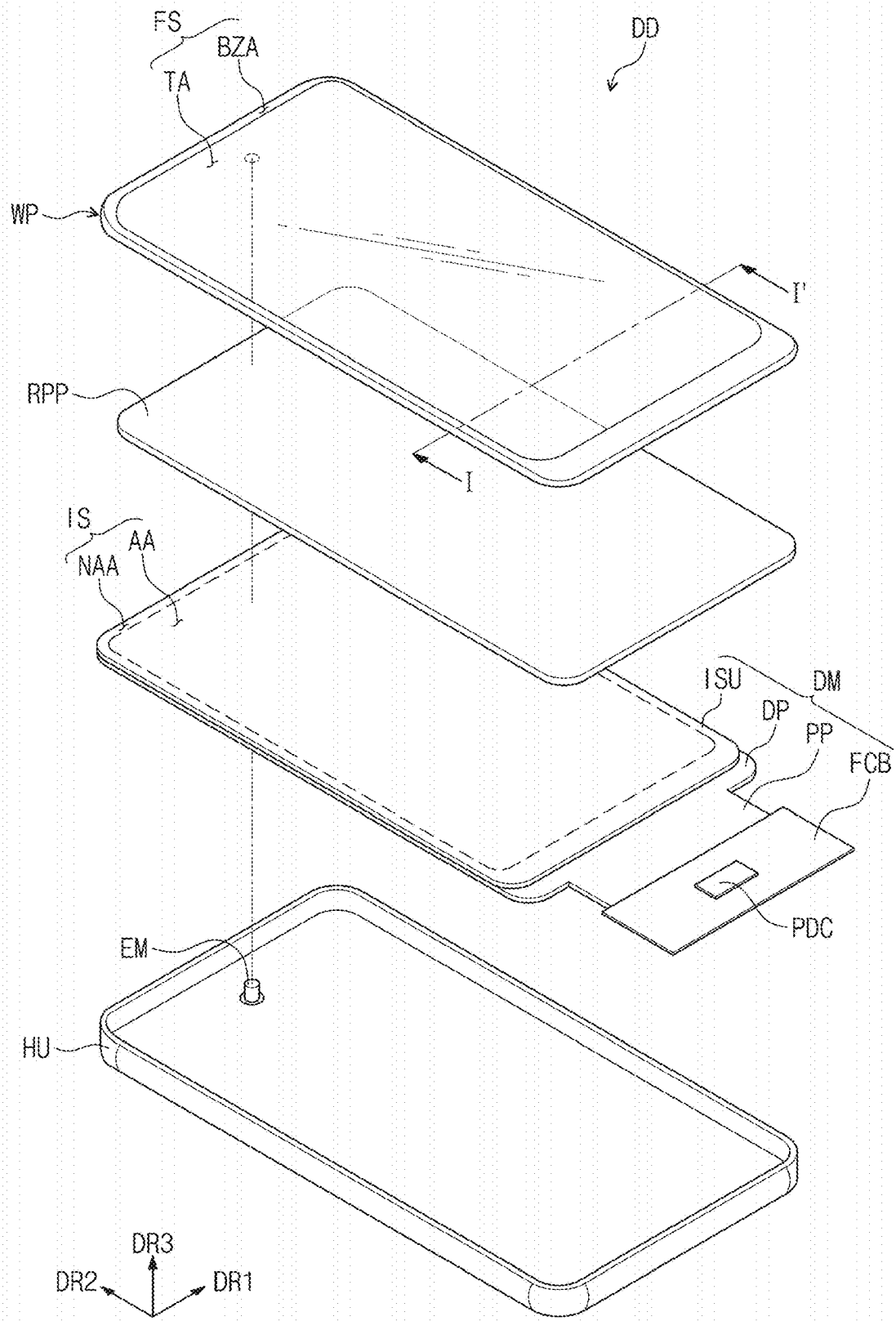
FIG. 2 illustrates an exploded perspective view of the display device.

FIG. 1 is a perspective view illustrating a display device DD according to an embodiment, and FIG. 2 is an exploded perspective view of the display device DD according to an embodiment.

Referring to FIGS. 1 and 2, the display device DD may be activated according to an electrical signal. The display device DD may be used in a variety of applications. For example, an electronic device DD may be used for small and medium-sized electronic devices (e.g., personal computers, notebook computers, personal digital terminals, car navigation units, game machines, portable electronic devices, and cameras) and large electronic devices such as televisions, monitors, or external billboards, as well as in other electronic devices. In this embodiment, the display device DD is illustrated as a smart phone.

The display device ED may display an image IM toward the third direction DR3 on the display surface FS parallel to each of the first and second directions DR1 and DR2. The image IM may be a still image or a dynamic image. In FIG. 1, a clock and icons are illustrated as an example of the image IM. The display surface FS on which the image IM is displayed may correspond to a front surface of the display device DD and may correspond to the front surface of the window panel WP.

In this embodiment, the front (or upper surface) and the rear surface (or lower surface) of each member are defined based on the direction in which the image IM is displayed. The front and rear surfaces oppose each other in the third direction DR3, and a normal direction of each of the front and rear surfaces may be parallel to the third direction DR3. Moreover, the directions indicated by the first to third directions DR1, DR2, and DR3 are relative concepts and may be in other directions.

The display device DD according to the embodiment of the present invention may detect an externally applied user input. The user input may be generated, for example, by a body part (e.g., finger, etc.), light, heat, or pressure. In addition, the display device DD may detect a user input applied to a side or rear surface of the display device DD according to the structure of the display device DD, and is not limited to any one embodiment.

The display device DD may include a window panel WP, an anti-reflector RPP, a display module DM, a pressure electronic module EM, and a housing HU. In the present embodiment, the window panel WP and the housing HU are combined to form the exterior of the display device DD. The window panel WP may include an optically transparent insulating material. For example, the window panel WP may include glass or plastic. The window panel WP may have a multilayer structure or a single layer structure. For example, the window panel WP may include a plurality of plastic films bonded with an adhesive or may include a glass substrate and a plastic film bonded with an adhesive.

The display surface FS of the window panel WP may define the front surface of the display device DD and may include a transmissive area TA and a bezel area BZA. The transmission area TA may be an optically transparent area. For example, the transmission area TA may be an area having a visible light transmittance of about 90% or more. The bezel area BZA may be an area having relatively low light transmittance compared to the transmission area TA. The bezel area BZA may have a predetermined color and may correspond to the shape of the transmission area TA. The bezel area BZA is adjacent to and may entirely or partially surround the transmission area TA. According to an embodiment, the bezel area BZA may be omitted in the window panel WP.

An anti-reflector RPP can be placed under the window panel WP. The anti-reflector RPP reduces reflectance of external light incident from the upper side of the window panel WP. In one embodiment of the present invention, the anti-reflector RPP may be omitted or may be embedded in the display module DM.

The display module DM may display an image IM and detect an external input. The display module DM includes a front surface IS including an active area AA and a peripheral area NAA. The active area AA may be an area activated according to an electrical signal.

In this embodiment, the active area AA displays the image IM and also may be an area in which an external input is detected. The transmission area TA may overlap at least the active area AA. For example, the transmission area TA may overlap the entire surface or at least part of the active area AA. Accordingly, the user may visually recognize the image IM through the transmission area TA or provide an external input. However, this is illustrated as an example, and in the active area AA, an area in which the image IM is displayed and an area in which an external input is detected may be separated from each other, and this is not limited to any one embodiment.

The peripheral area NAA may be an area covered by the bezel area BZA and may be adjacent to the active area AA. The peripheral area NAA can surround the active area AA. A driving circuit or driving wire to drive the active area AA may be in the peripheral area NAA.

In this embodiment, the display module DM is assembled in a flat state, with the active area AA and the peripheral area NAA facing the window panel WP. However, this is illustrated by way of example, and part of the peripheral area NAA of the display module DM may be bent in some embodiments. In this case, a portion of the peripheral area NAA may face the rear surface of the display device DD, so that the bezel area BZA in front of the display device DD may be reduced. In one embodiment, the display module DM may be assembled in a state in which a part of the active area AA is also bent.

The display module DM may include a display panel DP, an input sensor ISU, a driving circuit DC and a printed circuit board FCB. The display panel DP may be a component that substantially generates an image IM. The image IM generated by the display panel DP may be visually recognized by a user through the transmission area TA.

The input sensor ISU detects an external input and, as described above, may detect an external input provided to the window panel WP.

The display panel DP may include a pad area PP. In one embodiment, a plurality of signal pads may be disposed in the pad area PP of the display panel DP. The display panel DP may be electrically connected to the printed circuit board FCB through signal pads. In an embodiment, a driving chip that generates signals for operation of the display panel DP may be mounted in the pad area PP.

The printed circuit board FCB may include various driving circuits for driving the display panel DP and the input sensor ISU, or a connector for supplying power. In an embodiment, the printed circuit board FCB may include a panel driving circuit PDC for driving the display panel DP. The panel driving circuit PDC is formed of an integrated circuit and may be mounted on the printed circuit board FCB.

The electronic module EM may be disposed under the display module DM. In an embodiment, the electronic module EM may be coupled to the rear surface of the display module DM through an adhesive member. On a plane, the electronic module EM may overlap the active area AA. Accordingly, a space for accommodating the electronic module EM in the bezel area BZA may be omitted, which may prevent increasing the size of the bezel area BZA.

For example, when the electronic module EM includes a light source element that outputs light (e.g., an infrared light emitting diode, an organic emission diode, a laser diode, or a phosphor), the electronic module EM may output light through the transmission area TA. When the electronic module EM is a light-receiving module (e.g., an infrared detection sensor, proximity sensor, charge-coupled device (CCD), light detection sensor, phototransistor, or photodiode), the electronic module EM may receive external light transmitted through the transmission area TA. In an embodiment, the electronic module EM may be a camera or another functional circuit or module. The electronic module EM does not necessarily need to be configured as a single element, and a plurality of elements may be gathered and configured in an array form in one embodiment.

The functional module may be considered to be a functional area which, for example, is dedicated to performing a predetermined function of the display device or electronic device including the display device. The predetermined function may be associated, for example, with an application or feature of the electronic device or display device, and thus may correspond to functions other than the camera function described above.

The housing HU is coupled to the window panel WP. In one embodiment, the housing HU may be coupled with the window panel WP to provide a space for accommodating the anti-reflector RRP, the display module DM, and the electronic module EM. The housing HU may include a material having relatively high rigidity. For example, the housing HU may include a plurality of frames and/or plates made of glass, plastic, or metal, or a combination thereof. The housing HU may stably protect components of the display device DD accommodated in the internal space from external impact.

Figure 3:
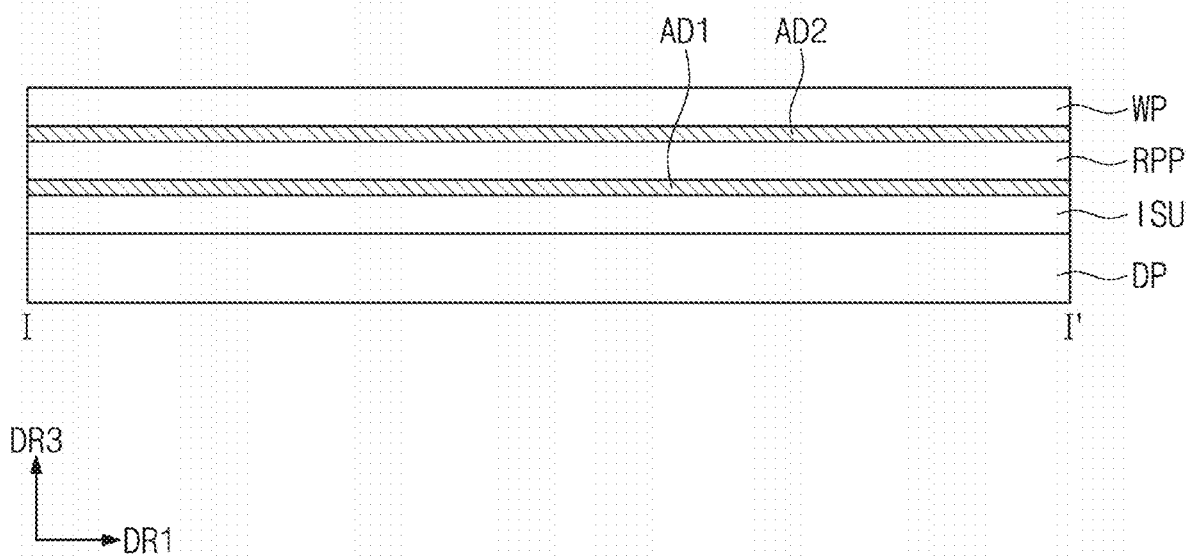
FIG. 3 illustrates an embodiment of a cross-sectional view along line I-I' of FIG. 2.

FIG. 3 is a cross-sectional view taken along line I-I' shown in FIG. 2 according to an embodiment. In FIG. 3m, a cross section of the display device DD corresponds to the first direction DR1 and the third direction DR3, and constituent elements of the display device DD are illustrated in simple form to explain their stacking relationship.

According to an embodiment of the present invention, the display device DD may include a display panel DP, an input sensor ISU, an anti-reflector RPP, and a window panel WP. At least some of the components of the display panel DP, the input sensor ISU, the anti-reflector RRP, and the window panel WP may be formed by a continuous process, or at least some of the components may be bonded to each other through an adhesive member. For example, the input sensor ISU and the anti-reflector RPP may be coupled by the adhesive member AD1. The anti-reflector RPP and the window panel WP may be coupled to each other by an adhesive member AD2.

The adhesive members AD1 and AD2 may be transparent adhesive members, such as a pressure sensitive adhesive film (PSA), an optically clear adhesive film (OCA), or an optically clear resin (OCR). The adhesive member described below may include an adhesive or pressure-sensitive adhesive. In an embodiment of the present invention, the anti-reflector RPP and the window panel WP may be replaced or omitted by other components.

Among the input sensor ISU, the anti-reflector RPP, and the window panel WP in FIG. 3, the input sensor ISU (which may be formed through a continuous process together with the display panel DP) is directly disposed on the display panel DP. In one embodiment, an indication that a configuration of B is directly disposed on configuration of A may indicate that a separate adhesive layer/adhesive member is not disposed between the configuration of A and the configuration of B. The configuration of B may be formed through a continuous process on the base surface provided by the configuration of A, after the configuration of A is formed.

In one embodiment, the anti-reflector RPP and the window panel WP are of the panel type, and the input sensor ISU is of the layer type. The panel type may include, for example, a base layer providing a base surface such as a synthetic resin film, a composite material film, a glass substrate, and the like. A layer type may omit a base layer. For example, layer-type components may be disposed on a base surface provided by other components. In an embodiment of the present invention, the anti-reflector RPP and the window panel WP may be a layer type.

The display panel DP generates an image, and the input sensor ISU acquires coordinate information of an external input (e.g., a touch event). According to an embodiment of the present invention, the display device DD may further include a protection member on a lower surface (or rear surface) of the display panel DP. The protection member and the display panel DP may be coupled through an adhesive member.

According to an embodiment of the present invention, the display panel DP may be a light emitting display panel, but is not particularly limited. For example, the display panel DP may be an organic light emitting display panel or a quantum dot light emitting display panel. The panels may be classified according to the material of the light emitting element. In the organic light emitting display panel, the light emitting layer may include an organic light emitting material. The light emitting layer of the quantum dot light emitting display panel may include quantum dot, and/or quantum rod. Hereinafter, the display panel DP is described as an organic light emitting display panel.

The anti-reflector RPP reduces the reflectance of external light incident from the upper side of the window panel WP. According to an embodiment of the present invention, the anti-reflector RPP may include a phase retarder and a polarizer. The phase retarder may be a film-type or a liquid crystal coating-type. The polarizer may also be a film-type or liquid crystal coating-type. The film-type may include a stretchable synthetic resin film, and the liquid crystal coating-type may include liquid crystals arranged in a predetermined arrangement. The retarder and the polarizer may further include a protective film. The retarder and the polarizer itself or a protective film may be defined as a base layer of an anti-reflector RPP.

According to an embodiment of the present invention, an anti-reflector RPP may include color filters having a predetermined arrangement. The arrangement of color filters may be determined based on, for example, the emission colors of pixels in the display panel DP. The anti-reflector RPP may further include a black matrix adjacent to the color filters.

According to an embodiment of the present invention, the anti-reflector RPP may include a destructive interference structure. For example, the destructive interference structure may include a first reflective layer and a second reflective layer disposed on different layers. The first reflected light and the second reflected light reflected from the first reflective layer and the second reflective layer, respectively, may be destructively interfered. Thus, reflectance of external light may be reduced.

According to an embodiment of the present invention, the window panel WP may include a glass substrate and/or a synthetic resin film. The window panel WP is not limited to a single layer. The window panel WP may include two or more films coupled by an adhesive member. The window panel WP may further include a functional coating layer. The functional coating layer may include, for example, an anti-fingerprint layer, an anti-reflection layer, and/or a hard coating layer.

Figure 4:
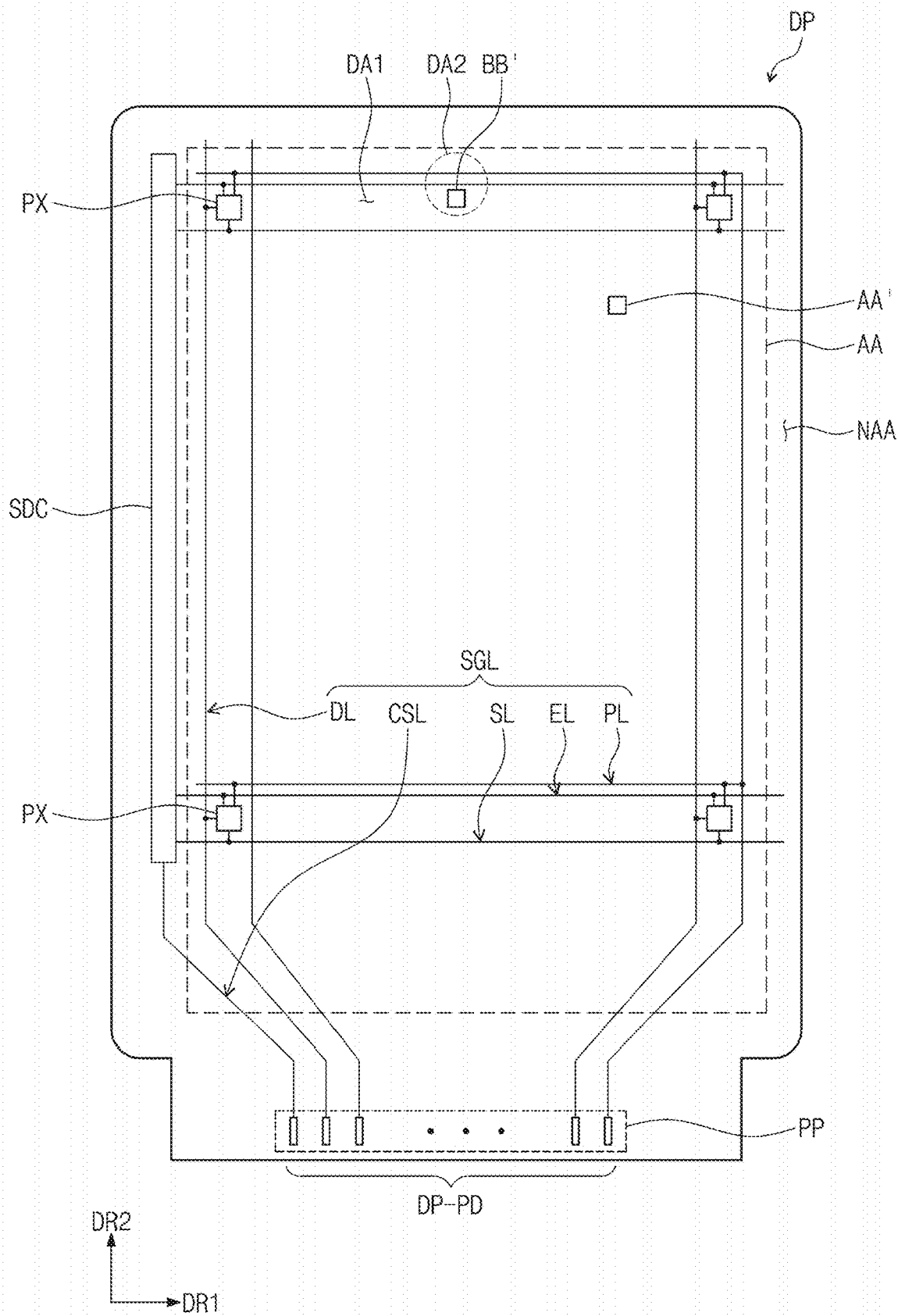
FIG. 4 illustrates an embodiment of a display panel.

FIG. 4 is a plan view of an embodiment of the display panel DP, which may include a scan driving circuit SDC, a plurality of signal lines SGL (signal lines), a plurality of signal pads DP-PD, and a plurality of pixels PX (pixels).

The scan driving circuit SDC generates a plurality of scan signals (scan signals), and sequentially outputs the scan signals to a plurality of scan lines SL (scan lines) to be described later. The scan driving circuit SDC may output not only scan signals but also other control signals to the pixels PX. The scan driving circuit SDC may include a plurality of transistors formed through substantially the same process as the transistors in the pixels PX.

The signal lines SGL include scan lines SL, data lines DL, power lines PL, emission control lines EL, and control signal lines CSL. Each of the scan lines SL, the data lines DL, and the emission control lines EL is connected to a corresponding pixel PX among the pixels PX. The power line PL is commonly connected to the pixels PX. The control signal line CSL may provide control signals to the scan driving circuit SDC. The power line PL may provide a voltage for the operation of the pixels PX. The power line PL may include a plurality of lines that provide different voltages.

In one embodiment, the signal lines SGL may further include auxiliary lines SSL connected to the input detection layer ISL (e.g., refer to FIG. 2). In one embodiment of the present invention, the auxiliary lines SSL may be omitted. The auxiliary lines SSL are respectively connected to the contact holes CNT and may be electrically connected to signal lines of an input sensor ISU (e.g., see FIG. 6) through contact holes CNT.

The signal pads DP-PD may be electrically connected to the data lines DL, the power line PL, and the control signal line CSL. The signal pads DP-PD are adjacent to each other in a pad area PP located in a partial area of the peripheral area NAA.

The active area AA may include the pixels PX. A plurality of electronic elements may be in the active area AA. The electronic elements may include organic light emitting diodes provided in respective ones of the pixels PX and corresponding pixel driving circuits connected thereto. The scan driving circuit SDC, the signal lines SGL, the signal pads DP-PD and IS-PD, and the pixel driving circuit may be in the circuit element layer DP-CL, for example, as illustrated in FIG. 3.

Each of the pixels PX may include a plurality of transistors, a capacitor, and an organic light emitting diode. The pixels PX emit light in response to signals received through the scan lines SL, the data lines DL, the emission control lines EL, and the power line PL.

The signal pads DP-PD and IS-PD of the display panel DP may be electrically connected to the printed circuit board FCB shown in FIG. 2.

A portion of the display panel DP illustrated in FIG. 4 may be bent. A portion of the peripheral area NAA of the display panel DP may be bent, for example, based on a bending axis parallel to the first direction DR1. The bending axis may be defined to overlap a part of the data lines DL.

A first display area DA1 and a second display area DA2 may be in the display panel DP and may constitute an active area AA of the display panel DP. The first display area DA1 may surround the second display area DA2. The second display area DA2 may overlap the electronic module EM (e.g., refer to FIG. 2) on a plane and may be an area adjacent to the first display area DAL The resolution of the first display area DA1 may be different from the resolution of the second display area DA2. For example, the resolution of the second display area DA2 may be lower than that of the first display area DA1.

The transmittance of the second display area DA2 may be higher than that of the first display area DA1. Therefore, it may be possible to easily transmit/receive optical signals to/from the electronic module EM disposed under the second display area DA2.

Figure 5:
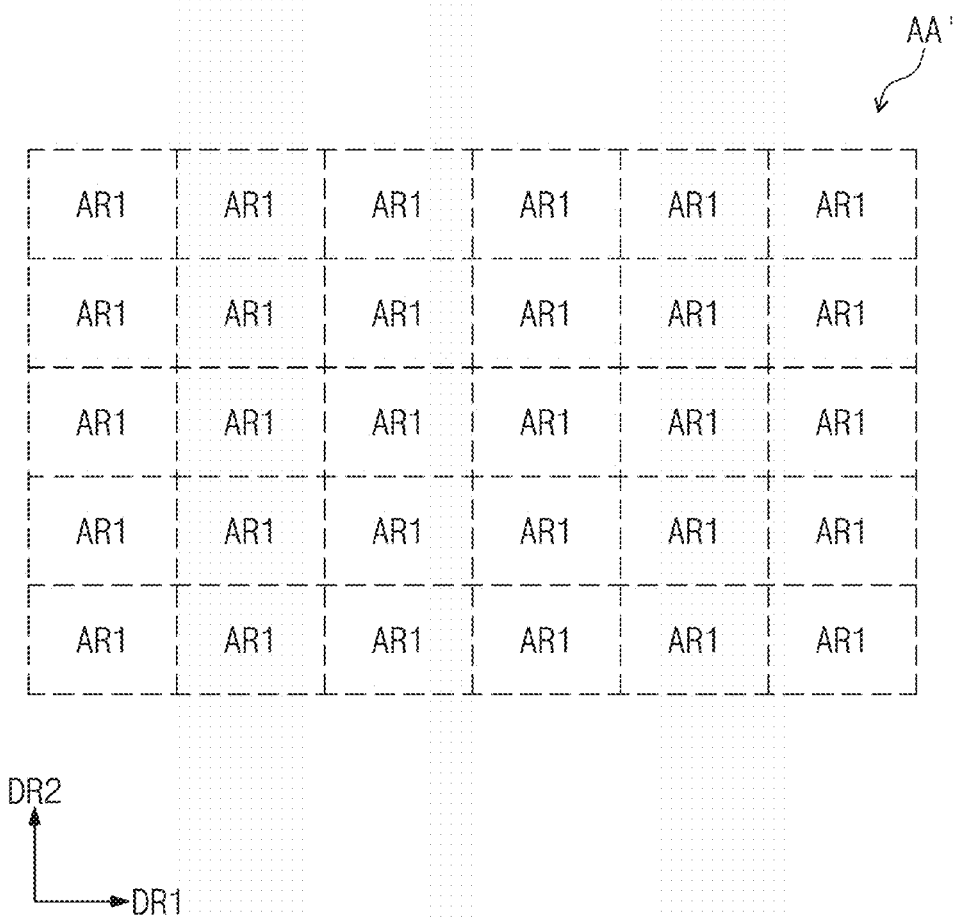
FIG. 5 illustrates an embodiment of enlarged area AA' of FIG. 4.
Figure 6:
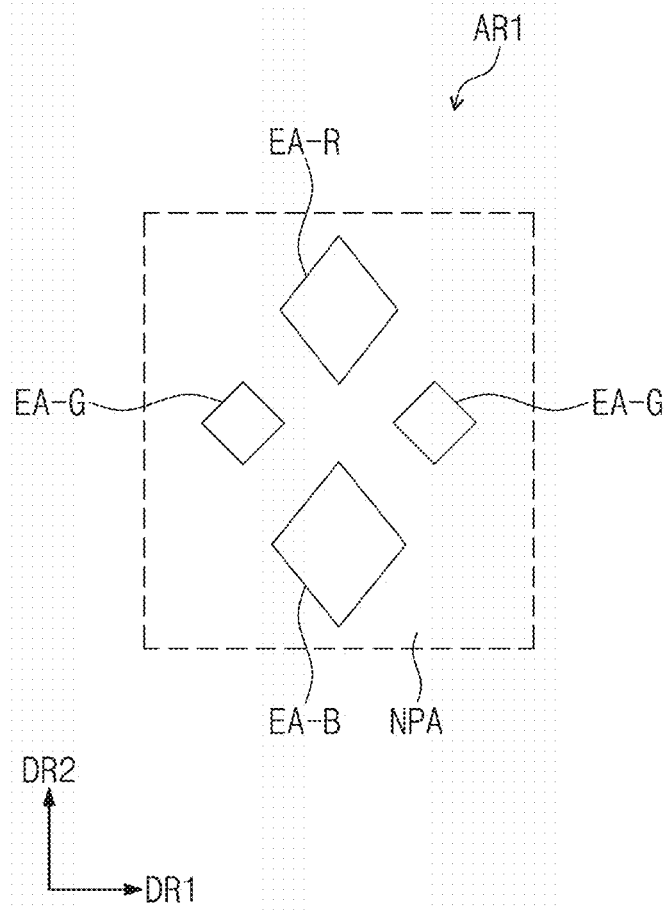
FIG. 6 illustrates an embodiment of light emitting areas in a pixel unit.

FIG. 5 is a plan view illustrating an embodiment of enlarged area AA' of FIG. 4. In FIG. 5, the pixel units arranged in the area AA' of FIG. 4 are simplified and illustrated. FIG. 6 is a plan view illustrating a configuration of light emitting areas in one pixel unit of FIG. 5 according to an embodiment.

Referring to FIGS. 4 and 5, the first display area DA1 may be divided into first pixel units AR1. At least one pixel may be in each of the first pixel units AR1. The first pixel unit AR1 may be an area that provides an image. The first pixel units AR1 may be arranged along each of the first direction DR1 and the second direction DR2. Pixels in the first pixel units AR1 may provide light.

Referring to FIGS. 4 to 6, light emitting areas EA-B, EA-G, and EA-R may be in each of the first pixel units AR1 disposed in the first display area DA1. The first light emitting area EA-B is a light emitting area of a first color pixel, the second light emitting area EA-G is a light emitting area of a second color pixel, and the third light emitting area EA-R is the light emitting area of the third color pixel. Each of the light emitting areas EA-B, EA-G, and EA-R may correspond to the pixel PX.

The first pixel units AR1 may include a first light emitting area EA-B, a second light emitting area EA-G, and a third light emitting area EA-R. In the embodiment illustrated in FIG. 6, each of the first pixel units AR1 includes one first light emitting area EA-B, two second light emitting areas EA-G, and one third light emitting area EA-R. However, the embodiment is not limited thereto.

In addition, the shape of each of the light emitting areas EA-B, EA-G, and EA-R in the first pixel unit AR1 is illustrated as having a rhombus shape on a plane, but may have a different shape in another embodiment.

Referring to FIG. 6, two second light emitting areas EA-G in one first pixel unit AR1 are spaced apart from each other in a first direction DR1, and the first light emitting area EA-B and the third light emitting area EA-R may be spaced apart from each other, with the second light emitting areas EA-G interposed therebetween. The light emitting areas EA-B, EA-G, and EA-R may be distinguished from each other by a non-light emitting area NPA. The light emitting areas EA-B, EA-G, and EA-R are areas divided by a pixel defining film PDL (e.g., see FIG. 9). The non-light emitting area NPA may overlap the pixel defining film PDL.

In one embodiment, one of the two second light emitting areas EA-G in one first pixel unit AR1 may correspond to a fourth light emitting area, that is distinguished from the second light emitting area EA-G. In FIG. 6, the two second light emitting areas EA-G are illustrated as having substantially the same shape and substantially the same area on a plane, but the embodiment is not limited thereto. In an embodiment, the second light emitting area EA-G and the fourth light emitting area may have different planar shapes and/or different areas.

In an embodiment, the configuration of the first pixel units AR1 in the first display area DA1 is not limited to that illustrated in the drawings. The number of light emitting areas in one first pixel unit AR1, the ratio of the areas between different light emitting areas, the arrangement relationship of the light emitting areas, the shape of each light emitting area, and/or the like may vary among embodiments and/or may be combined according to the display quality of the display panel DP.

In an embodiment, one first light emitting area EA-B may generate blue light. Each of the two second light emitting areas EA-G may generate green light. One third light emitting area EA-R may generate red light. The blue light, the green light, and the red light can be changed to a different combination of three primary color light in another embodiment.

Figure 8:
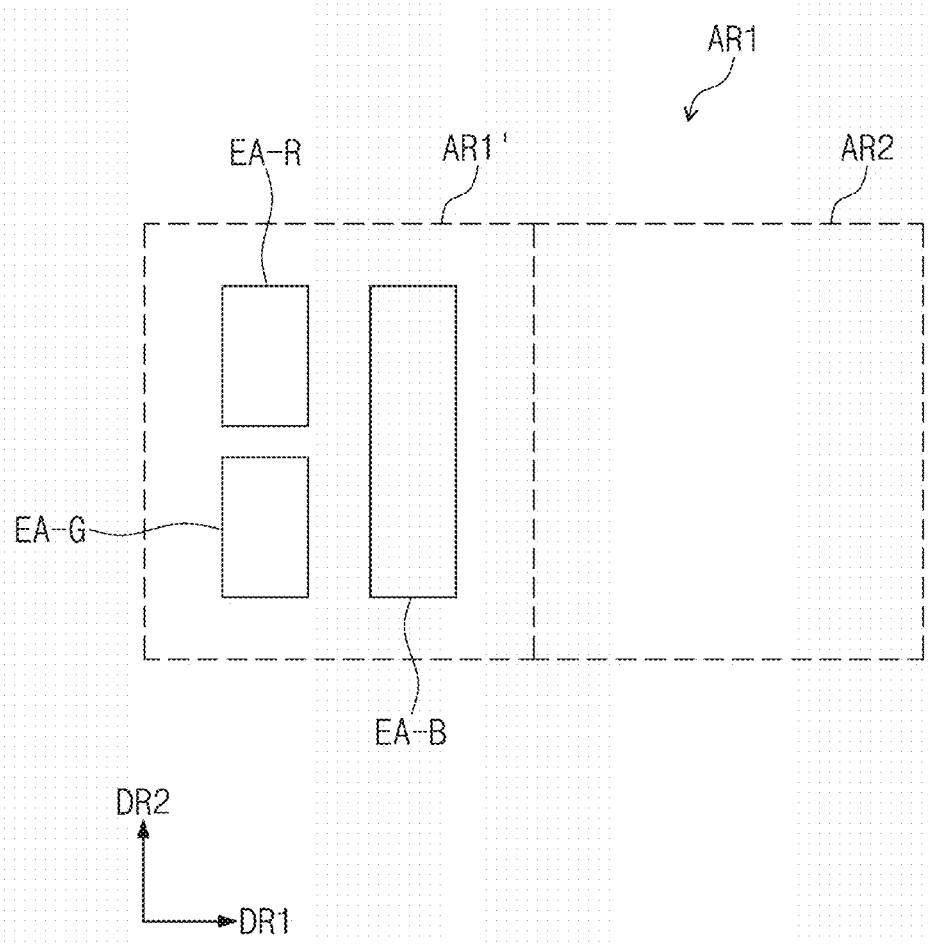
FIG. 8 illustrates an embodiment of part of area BB' shown in FIG. 7.

FIG. 7 is a plan view showing an embodiment of area BB' of FIG. 4. In FIG. 7, the pixel units arranged in area BB' of FIG. 4 are simplified and illustrated. FIG. 8 is a plan view showing an embodiment of part of area BB' shown in FIG. 7.

Referring to FIGS. 4 and 7, the second display area DA2 may include a second pixel unit AR1' and a non-pixel unit AR2. The second pixel unit AR1' may be substantially the same as one of the first pixel units AR1 of FIG. 5.

One pixel may be disposed in the second pixel unit AR1', and the second pixel unit AR1' may be an area providing an image. At least one missing pixel may be disposed in the non-pixel unit AR2. The missing pixel may be one in which one or more elements constituting the pixel are omitted. A pixel in the second pixel unit AR1' may provide light, and the missing pixel in the non-pixel unit AR2 may not provide light. Semiconductor patterns, conductive patterns, metal patterns, and/or signal lines may not be in the non-pixel unit AR2. In addition, a reflective electrode, a non-transmissive electrode, and the like may be not in the non-pixel unit AR2. In addition, the optical signal may be substantially moved through the non-pixel unit AR2. For example, a signal provided from the electronic module EM (e.g., refer to FIG. 2) may be output through the non-pixel unit AR2, or an input signal may be received by the electronic module EM.

For example, the non-pixel unit AR2 may be an area that does not include any pixels. The non-pixel unit AR2 may be a low reflection area, a transmission area, a non-display area, a non-light emitting area, or a semi-transmission area. Since the second display area DA2 includes non-pixel unit AR2 that cannot provide an image, the resolution may be lower than that of the first display area DA1.

A plurality of second pixel units AR1' may be in the second display area DA2, and a plurality of non-pixel units AR2 may be provided. The second pixel units AR1' and the non-pixel units AR2 may be arranged, for example, according to a predetermined rule. In the embodiment of FIG. 7, 29 non-pixel units AR2 may be arranged around one second pixel unit AR1'. In FIG. 7, an arrangement relationship between the second pixel unit AR1' and the non-pixel units AR2 is illustrated as an example. However, the present invention is not limited thereto. If the second display area DA2 has a structure including both the second pixel units AR1' and the non-pixel units AR2, various modifications may be made, for example, in terms of the arrangement between th second pixel unit AR1' and the non-pixel units AR2.

FIG. 8 is a plan view showing an embodiment of the second pixel unit AR1' and the non-pixel unit AR2 in the second display area DA2. As illustrated, the second pixel unit AR1' may include at least three light emitting areas EA-B, EA-G, and EA-R. The second pixel unit AR1' may include one first light emitting area EA-B, a second light emitting area EA-G, and one third light emitting area EA-R. The colors and/or numbers of light emitting areas and their relative arrangement may be different in another embodiment. In addition, the shape of each of the light emitting areas EA-B, EA-G, and EA-R in the second pixel unit AR1' is shown to have a rectangular shape on a plane, but may have a different shape in another embodiment.

Referring to FIG. 8, in one second pixel unit AR1', the second light emitting area EA-G and the third light emitting area EA-R may be spaced apart in the second direction DR2. The first light emitting area EA-B may be spaced apart from the second light emitting area EA-G and the third light emitting area EA-R along the first direction DR1. In one embodiment, the first light emitting area EA-B may have an area larger than the sum of the areas of the second light emitting area EA-G and the third light emitting area EA-R. However, the relative sizes may be different in another embodiment.

In one embodiment, first pixel unit AR1 of FIG. 5 and second pixel unit AR1' of FIG. 7 may have substantially the same light emitting areas. In an embodiment, the size of the second pixel unit AR1' may be different from the size of the first pixel unit AR1. For example, the size of the second pixel unit AR1' may be larger than the size of the first pixel unit AR1. However, these sizes may be different in another embodiment.

Figure 9:
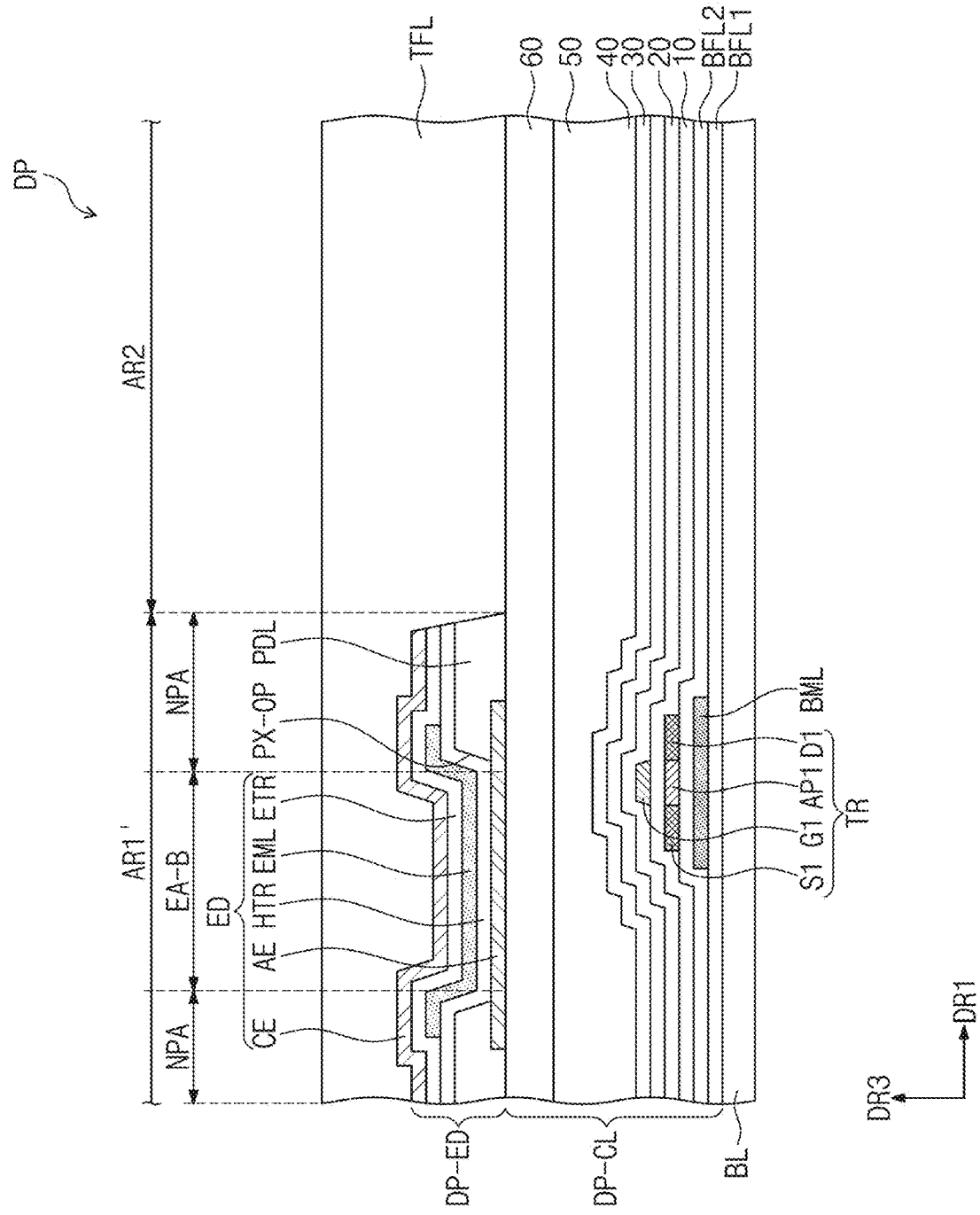
FIG. 9 illustrates an embodiment of a cross-sectional view of part of a second display area in a display panel.

FIG. 9 is a cross-sectional view illustrating a part of a second display area in a display panel of a display device according to an embodiment.

Referring to FIG. 9, the display panel DP may include a plurality of insulating layers, a semiconductor pattern, a conductive pattern, a metal pattern, and a signal line. An insulating layer, a semiconductor layer, a conductive layer, and a metal layer may be formed, for example, by a coating or vapor deposition method. Thereafter, the insulating layer, the semiconductor layer, the conductive layer, and the metal layer may be selectively patterned by a photolithography method. In this way, semiconductor patterns, conductive patterns, shielding patterns, metal patterns, signal lines, and the like in the circuit element layer DP-CL and the light emitting element layer DP-ED are formed. Thereafter, an upper insulating layer TFL covering the light emitting element layer DP-ED may be formed.

The transistor TR and the light emitting element ED may be disposed on the base layer BL. The light emitting element ED may include a first electrode AE and a second electrode CE, and a light emitting layer EML between the first electrode AE and the second electrode CE. In addition, the light emitting element ED may include a hole transport region HTR between the first electrode AE and a light emitting layer EML, and an electron transport region ETR between the light emitting layer EML and the second electrode CE.

The first buffer layer BFL1 may be on the base layer BL to improve bonding strength of metal patterns, such as the base layer BL and the shielding pattern BML. The first buffer layer BFL1 may include at least one of a silicon oxide layer or a silicon nitride layer. In one embodiment, silicon oxide and silicon nitride layers may be alternately stacked.

A shielding pattern BML may be on the first buffer layer BFL1. In an embodiment, the first buffer layer BFL1 may be omitted. In this case, the shielding pattern BML may be on the upper surface of the base layer BL.

The shielding pattern BML may overlap the transistor TR and may overlap with the active AP1, and may serve as a protective layer to prevent deterioration of electrical characteristics of the active AP1. In addition, the transistor TR may be protected from light or moisture introduced from the lower portion of the base layer BL in the manufacturing process of the electronic device. The shielding pattern BML may be formed of a metal material having, for example, a low light transmittance. For example, the shielding pattern BML may be a metal pattern formed of molybdenum (Mo) or the like.

Light incident on the shielding pattern BML may be reflected from the upper or lower surface of the shielding pattern BML. In an embodiment, the second buffer layer BFL2 may be on a shielding pattern BML and may cover all or a portion of the shielding pattern BML. A semiconductor pattern is disposed on the second buffer layer BFL2 and may include a silicon semiconductor material. The semiconductor pattern may include, for example, polysilicon, amorphous silicon, or a metal oxide semiconductor material.

Semiconductor patterns have different electrical properties depending on whether they are doped or not. The semiconductor pattern may include a doping area and a non-doping area according to the degree of doping. The doping area may be doped with an N-type dopant or a P-type dopant. The P-type transistor includes a doping area doped with a P-type dopant.

The doping area may have a doping concentration greater than that of the non-doping area, and the doping area may have a conductivity greater than that of the non-doping area. The doping area may substantially serve, for example, as an electrode or signal line. The non-doping area may correspond to an active region (or channel) of the transistor. For example, a portion of the semiconductor pattern may be the active region (or channel) of the transistor, another part may be a source region (or input electrode) or a drain region (output electrode) of the transistor, and another part may be a connection signal line (or connection electrode). In one embodiment, a dopant may also be doped in the active region (or channel) of the transistor.

As shown in FIG. 9, the source S1, the active AP1, and the drain D1 of the transistor TR are formed from a semiconductor pattern. The first insulating layer 10 may be on the semiconductor pattern. The gate G1 of the transistor TR may be on the first insulating layer 10. A second insulating layer 20 may be on the gate G1. A third insulating layer 30 to a fifth insulating layer 50 may be on the second insulating layer 20.

The transistor TR and the light emitting element ED may be electrically connected by a connection electrode. For example, the connection electrode may electrically connect the transistor TR and the light emitting element ED through contact holes in the third insulating layer 30 to the fifth insulating layer 50. A sixth insulating layer 60 may be on the fifth insulating layer 50. In FIG. 9, the first to sixth insulating layers 10 to 60 are stacked, but the number of insulating layers may be reduced or additionally insulating layers added to be different from that shown in FIG. 9.

A layer from the buffer layer BFL to the sixth insulating layer INS6 may correspond to a circuit element layer DP-CL. The circuit element layer DP-CL may include at least one metal pattern, such as a shielding pattern BML, semiconductor patterns S1, A1, and D1, a gate G1, or a connection electrode. At least one metal pattern may not be in the non-pixel unit AR2. The non-pixel unit AR2 does not include the shielding pattern BML, the semiconductor patterns S1, A1, and D1, the gate G1, and the like and may include a plurality of insulating layers. The non-pixel unit AR2 may correspond to a transmission area having a higher light transmittance than that of the second pixel unit AR1'. In an embodiment of the display device DD, a portion corresponding to the non-pixel unit AR2 may be referred to as a non-pixel area and a portion corresponding to the second pixel unit AR1' may be referred to as a pixel area.

The first electrode AE may be on the sixth insulating layer 60 and may serve as an anode electrode. A pixel defining film PDL may be on the first electrode AE and the sixth insulating layer 60. In the pixel defining film PDL, an opening part PX_OP may expose a predetermined portion of the first electrode AE. The pixel defining film PDL may be formed of a polymer resin. For example, the pixel defining film PDL may be formed of a polyacrylate-based resin or a polyimide-based resin. In addition, the pixel defining film PDL may be formed by further including an inorganic material in addition to the polymer resin.

In one embodiment, the pixel defining film PDL may be formed by including a light absorbing material or may be formed by including a black pigment or a black dye. A pixel defining film PDL formed including a black pigment or black dye may implement a black pixel defining film. When forming the pixel defining film PDL, carbon black or the like may be used as a black pigment or black dye, but embodiments are not limited thereto.

The hole transport region HTR may be on the first electrode AE and the pixel defining film PDL. The hole transport region HTR may be commonly disposed in the first light emitting area EA-B and the non-light emitting area NPA. The hole transport region HTR may include a hole transport layer and a hole injection layer.

The light emitting layer EML may be on the hole transport region HTR and may be in an area corresponding to the opening part PX_OP. The light emitting layer EML may include an organic material and/or an inorganic material. In FIG. 9, the light emitting layer EML may, for example, emit blue light in the first light emitting area EA-B. The light emitting layer may generate green light in the second light emitting area EA-G, and the light emitting layer may generate red light in the third light emitting area EA-R (e.g., see FIG. 8). The second light emitting area EA-G and the third light emitting area EA-R may also have a stacked structure corresponding to the first light emitting area EA-B illustrated in FIG. 9.

The electron transport region ETR may be on the light emitting layer EML and the hole transport region HTR. The electron transport region ETR may be commonly disposed in the first light emitting area EA-B and the non-light emitting area NPA. The electron transport region ETR may include an electron transport layer and an electron injection layer.

The second electrode CE may be on the electron transport region ETR and may serve as a cathode electrode. The second electrode CE may be provided as a common layer.

In an embodiment, the hole transport area HTR, the electron transport area ETR, and the second electrode CE are shown to extend to the non-light emitting area NPA, but the embodiment is not limited thereto. In one embodiment, the hole transport region HTR, the electron transport region ETR, and the second electrode CE may also be patterned and provided to correspond to the light emitting area.

The layer on which the light emitting element ED is disposed may be defined as the light emitting element layer DP-ED. The upper insulating layer TFL may be disposed on the light emitting element ED.

The first electrode AE may not be included in the non-pixel unit AR2. The non-pixel unit AR2 may overlap the upper insulating layer TFL. When the second electrode CE is a transparent electrode, non-pixel unit AR2 may include at least a part of second electrode CE.

In the part corresponding to the non-pixel unit AR2, an optical signal provided from outside of the display device DD may pass through the display panel DP and may be provided to the electronic module EM (e.g., refer to FIG. 2), or the optical signal emitted from the electronic module EM may pass through the display panel DP and be provided to outside the display device DD. Thus, because the metal pattern or the conductive pattern in the circuit element layer DP-CL of the display panel DP is not disposed in the portion corresponding to the non-pixel unit AR2, an optical signal provided as transmitted light can be freely transmitted.

Figure 10:
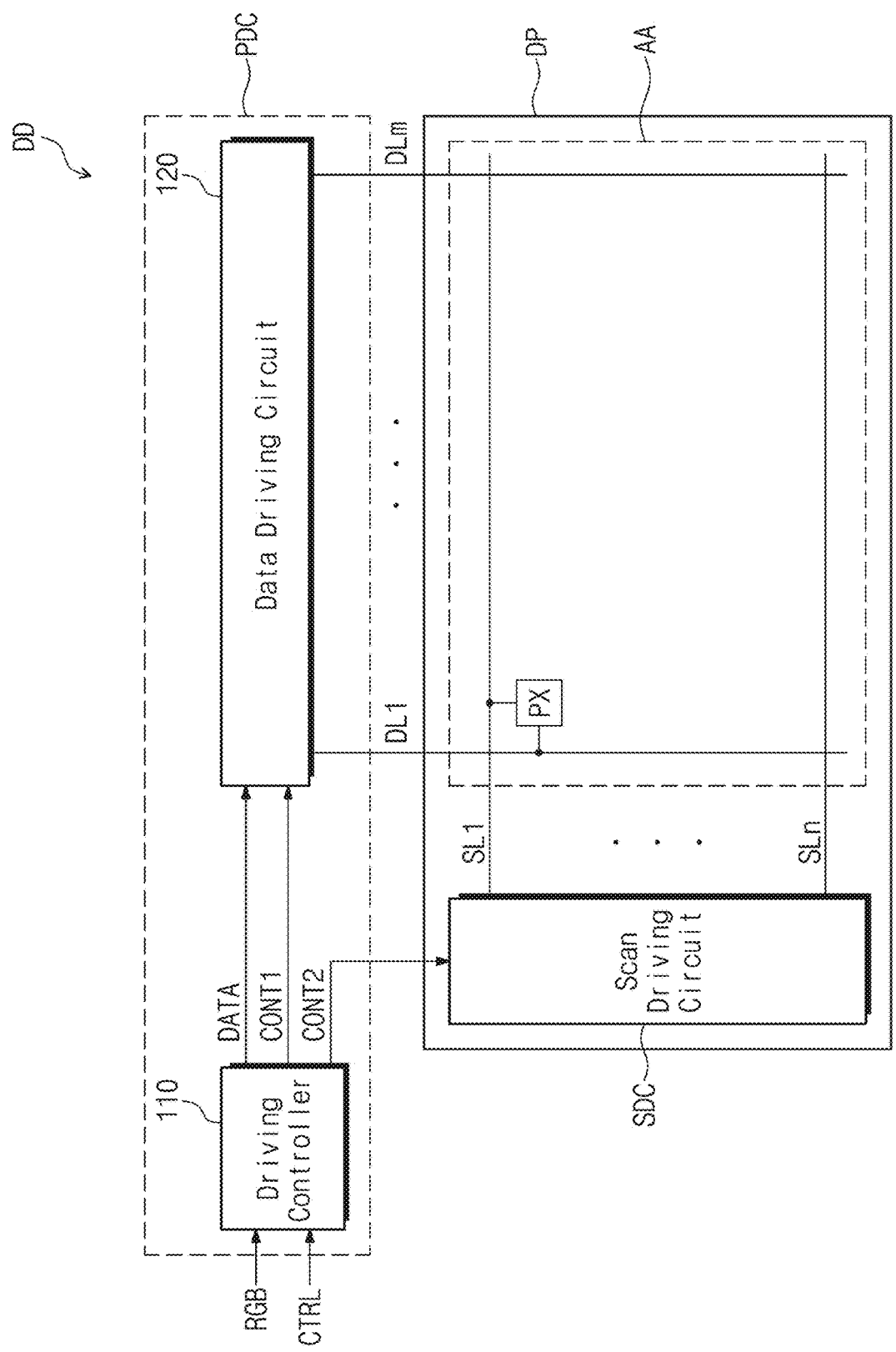
FIG. 10 illustrates an embodiment of a display device.

FIG. 10 is a block diagram illustrating a configuration of a display device DD according to an embodiment of the present invention.

Referring to FIG. 10, the display device DD includes a display panel DP and a panel driving circuit PDC. The display panel DP may be, for example, a liquid crystal display panel, organic light emitting display panel, electrophoretic display panel, electrowetting display panel, quantum dot display panel, or another type of panel. As described with reference to FIG. 4, the display panel DP may include a scan driving circuit SDC, scan lines SL1 to SLn, data lines DL1 to DLm, and pixels PX.

The panel driving circuit PDC receives the input image signal RGB and provides data signals corresponding to the data signals DATA to the pixels PX through the data lines DL1 to DLm of the display panel DP, to control display of an image based on light from the pixels PX.

The panel driving circuit PDC may include a driving controller 110 and a data driving circuit 120. The driving controller 110 receives an input image signal RGB and control signals CTRL from an external source. The control signals CTRL may include, for example, a vertical synchronization signal, a horizontal synchronization signal, a main clock signal, and a data enable signal. The driving controller 110 provides the data signal DATA and the first control signal CONT1, as processed by the input image signal RGB according to an operating condition of the display panel DP, to the data driving circuit 120 based on the control signals CTRL and provides the second control signal CONT2 to the scan driving circuit SDC. The first control signal CONT1 may include a horizontal synchronization start signal, a clock signal, and a line latch signal. The second control signal CONT2 may include a vertical synchronization start signal, an output enable signal, and a gate pulse signal. The driving controller 110 may change and output the data signal DATA in various ways, for example, based on the arrangement of pixels PX of the display panel DP and/or display frequency.

The scan driving circuit SD drives the scan lines SL1 to SLn in response to the second control signal CONT2 from the driving controller 110. The data driving circuit 120 drives the data lines DL1 to DLm in response to the data signal DATA and the first control signal CONT1 from the driving controller 110.

Figure 11:
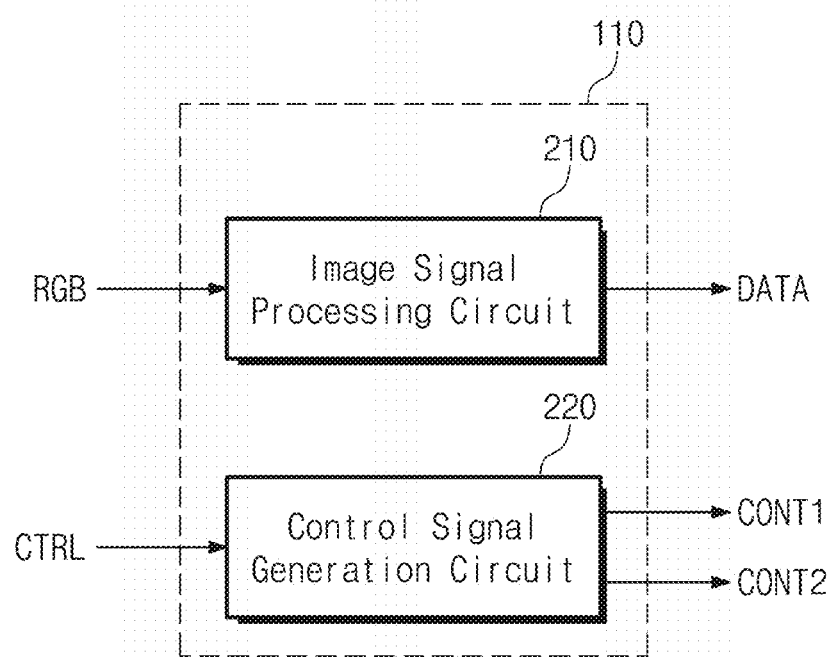
FIG. 11 illustrates an embodiment of a timing controller.

FIG. 11 is a block diagram showing an embodiment of driving controller 110, which may perform operations, for example, including those of a timing controller.

Referring to FIG. 11, the driving controller 110 includes an image signal processing circuit 210 and a control signal generation circuit 220. The image signal processing circuit 210 receives an input image signal RGB from an external source and outputs a data signal DATA. The control signal generation circuit 220 outputs a first control signal CONT1 and a second control signal CONT2 based on control signals CTRL received from an external source. The first control signal CONT1 may include a horizontal synchronization start signal, a clock signal, and a line latch signal, and the second control signal CONT2 may include a vertical synchronization start signal, an output enable signal, and a gate pulse signal.

In this embodiment, the input image signal RGB may include a first image signal corresponding to the second pixel unit AR1' and a second image signal corresponding to the non-pixel unit AR2 in the second display area DA2 (e.g., see FIG. 4) of the display panel DP. The image signal processing circuit 210 in the driving controller 110 calculates a first image signal, the second image signal, and preset kernel data to output a data signal DATA corresponding to the second pixel unit AR1'.

The image signal processing circuit 210 outputs a data signal DATA corresponding to the second pixel unit AR1' in consideration of not only the first image signal corresponding to the second pixel unit ARV, but also the second image signal corresponding to the non-pixel unit AR2. Thus, it is possible to prevent the display quality of the second display area DA2 from deteriorating.

Figure 12:
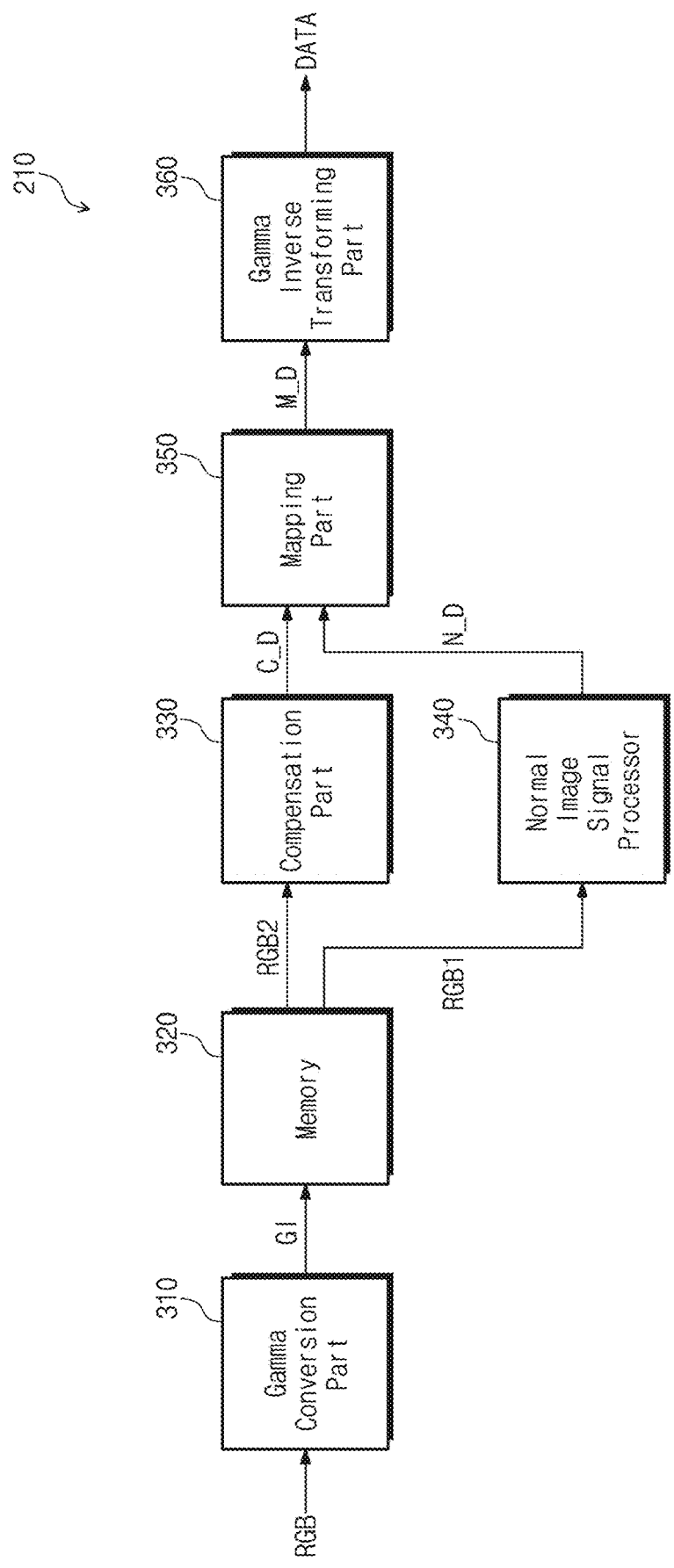
FIG. 12 illustrates an embodiment of an image signal processing circuit.

FIG. 12 is a block diagram showing an embodiment of the image signal processing circuit 210, which may include a gamma conversion part (or gamma converter) 310, a memory 320, a compensator 330, a normal image signal processing unit (or a normal image signal processor) 340, a mapping part (or mapping logic) 350, and a gamma inverse transforming part (or gamma inverse transformer) 360. The input image signal RGB may include a first color signal, a second color signal, and a third color signal.

The gamma conversion part (or gamma converter) 310 linearizes the input image signal RGB having non-linear characteristics and outputs the gamma image signal GI. For example, the gamma conversion part 310 may linearize the input image signal RGB based on a gamma look-up table to output the gamma image signal GI. The gamma lookup table may store luminance data according to a reference gamma value. For example, the reference gamma value may be one of various values such as 1.8, 2.2, 2.4, 4.0, or other values.

The memory 320 stores a gamma image signal GI output from the gamma conversion part 310. The memory 320 may be a line memory capable of storing a gamma image signal GI corresponding to a predetermined number of lines in an image of one frame. In an embodiment, the memory 320 may store a gamma image signal RGB1 of four lines. The memory 320 may output a first image signal RGB1 corresponding to a first display area DA1 and a second image signal RGB2 corresponding to a second display area DA2 (e.g., see FIG. 4).

The compensator 330 compensates for the second image signal RGB2 corresponding to the second display area DA2 and outputs the compensation image signal C_D. The compensation image signal C_D may include color signals corresponding to the three light emitting areas EA-B, EA-G, and EA-R shown in FIG. 8.

The normal image signal processing unit 340 converts the first image signal RGB1 corresponding to the first display area DA1 to a normal image signal N_D. The first image signal RGB1 may include a first color signal, a second color signal, and a third color signal. The normal image signal N_D may include first to fourth color signals corresponding to the four light emitting areas EA-B, EA-G, and EA-R, for example, as illustrated in FIG. 6.

The mapping part (or mapping logic) 350 receives a compensation image signal C_D from the compensator 330 and a normal image signal N_D from the normal image signal processing unit 340. The mapping part 350 maps the compensation image signal C_D and the normal image signal N_D to correspond to the pixels PX of the display panel DP (e.g., refer to FIG. 10) and outputs the mapping signal M_D. For example, the mapping part 350 may map the normal image signal N_D to the pixel unit in the first display area DA1, and may map the compensation image signal C_D to the pixel unit in the second display area DA2.

In one embodiment, the four light emitting areas EA-B, EA-G, and EA-R shown in FIG. 6 and the three light emitting areas EA-B, EA-G, and EA-R shown in FIG. 8 may correspond to the pixels PX, respectively.

The gamma inverse transforming part 360 may output the data signal DATA by non-linearizing the mapping signal M_D based on the output gamma look-up table (calculated by the inverse gamma function of the gamma look-up table) in the gamma conversion part 310. For example, when the gamma look-up table of the gamma conversion part 310 is formed by a gamma function having a 2.2 gamma value, the output gamma look-up table of the gamma inverse transforming part 360 may be formed by an inverse gamma function having a 2.2 gamma value. The output gamma lookup table may store grayscale data calculated by an inverse gamma function of the gamma lookup table. An embodiment of the operation of the compensator 330 is described below.

FIG. 13A illustrates an example of a second image signal RGB2 and a kernel matrix KN provided from the memory 320. In FIG. 13A, the second image signal RGB2 may include image signals A1 to A6, B1 to B6, C1 to C6, D1 to D6, and E1 to E6. The image signals A1 to A6 may be referred to as a first line L1, the image signals B1 to B6 may be referred to as a second line L2, the image signals C1 to C6 may be referred to as a third line L3, the image signals D1 to D6 may be referred to as a fourth line L4, and the image signals E1 to E6 may be referred to as a fifth line L5.

Referring to FIGS. 12 and 13A, all (or a portion of) the first to fifth lines L1 to L5 of the second image signal RGB2 may be provided from the memory 320. In one embodiment, the first to fourth lines L1 to L4 of the second image signal RGB2 may be provided from the memory 320, and the fifth line L5 may be a gamma image signal GI outputted from the gamma conversion part 310. Thus, the gamma image signal GI of the currently input line may be directly provided to the compensator 330 without passing through the memory 320.

The image signals A1 to A6, B1 to B6, C1 to C6, D1 to D6, and E1 to E6 may correspond to the second pixel unit AR1' and the non-pixel units AR2 in the area BB' illustrated in FIG. 7, respectively. In the example shown in FIG. 13A, the image signal C4 may correspond to the second pixel unit AR1'. The remaining image signals A1 to A6, B1 to B6, C1, C2, C3, C5, C6, D1 to D6, and E1 to E6 may correspond to the non-pixel units AR2, respectively.

The kernel matrix KN may include kernel data K11 to K16, K21 to K26, K31 to K36, K41 to K46, and K51 to K56. For example, the kernel matrix KN may include a×b (a and b are natural numbers) kernel data. In the following description, an example size of the kernel matrix KN is illustrated as 6×5, but the size of the kernel matrix KN may be different in another embodiment.

The compensator 330 performs a convolution operation on the image signals A1 to A6, B1 to B6, C1 to C6, D1 to D6, and E1 to E6 and the kernel data K11 to K16, K21 to K26, K31 to K36, K41 to K46, and K51 to K56, and outputs the compensation image signal C_D.

The compensator 330 may multiply each of the corresponding ones among the image signals A1 to A6, B1 to B6, C1 to C6, D1 to D6, and E1 to E6 in the second image signal RGB2 and the kernel data K11 to K16, K21 to K26, K31 to K36, K41 to K46, and K51 to K56 in the kernel matrix KN, and may output a value divided by the sum of kernel data as a compensation image signal C_D corresponding to the second pixel unit AR1'. For example, the compensation image signal C_D corresponding to the second pixel unit AR1' may be calculated by $\{(A1 \times K11)+(A2 \times K12)+ \ldots +(E6 \times K56)\}/(K11+K12+ \ldots +K56)$.

Figure 13B:
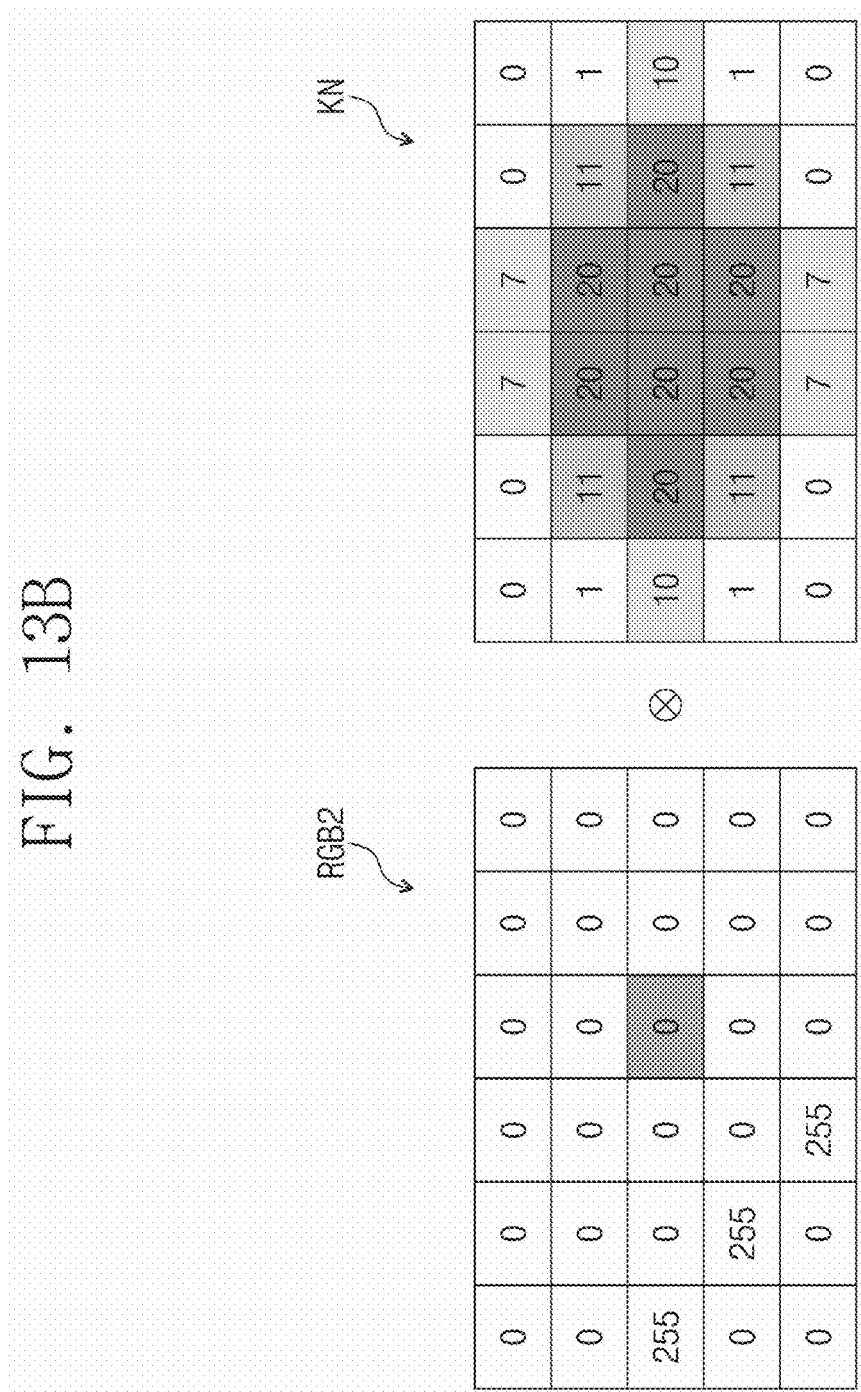

FIG. 13B shows examples of values of the second image signal RGB2 and the kernel matrix KN provided from the memory 320. Referring to FIGS. 13A and 13B, among the second image signals RGB2, the grayscale levels of the image signals C1, D2, and E3 are 255 and the gradation levels of the other image signals are 0. As described in FIGS. 5 to 8, since the second display area DA2 includes the non-pixel unit AR2 that cannot provide an image, the resolution may be lower than that of the first display area DA1.

When the image signal C4 is provided to the mapping part 350 as is without the compensation operation of the compensator 330 being performed, since the image signals A1 to A6, B1 to B6, C1, C2, C3, C5, C6, D1 to D6, and E1 to E6 corresponding to the non-pixel unit AR2 are not used, display quality of the second display area DA2 may be deteriorated.

In one embodiment, the compensator 330 outputs the compensation image signal C_D corresponding to the second pixel unit AR1' based on the image signal C4 corresponding to the second pixel unit AR1' and the image signals A1 to A6, B1 to B6, C1, C2, C3, C5, C6, D1 to D6, and E1 to E6 corresponding to the non-pixel unit AR2. It is therefore possible to prevent the display quality of the second display area DA2 from deteriorating.

The kernel data K11 to K16, K21 to K26, K31 to K36, K41 to K46, and K51 to K56 in the kernel matrix KN may be determined based on the image signals A1 to A6, B1 to B6, C1 to C6, D1 to D6, and E1 to E6 in the second image signal RGB2. The values of kernel data K11 to K16, K21 to K26, K31 to K36, K41 to K46, and K51 to K56 shown in FIG. 13 are only examples and may be different values in other embodiments.

FIGS. 14A to 14C are diagrams showing examples of kernel matrices which may correspond to various embodiments. FIG. 14A illustrates a kernel matrix KN1 corresponding to a pattern for enhancing and compensating an image around the second pixel unit AR1'. FIG. 14B illustrates a kernel matrix KN2 corresponding to a pattern for enhancing and compensating an image in a diagonal direction inclined from an upper left to a lower right around the second pixel unit AR1'. FIG. 14C illustrates a kernel matrix KN3 corresponding to a pattern for enhancing and compensating an image in a diagonal direction inclined from a lower left to an upper right around the second pixel unit AR1'. As shown in FIGS. 14A to 14C, the compensator 330 may compensate the second image signal RGB2 using any one of various kernel matrices KN1, KN2, or KN3.

FIGS. 15A to 15I are diagrams illustrating examples of a correspondence relationship between the second image signal RGB2 and the kernel matrix KN according to one or more embodiments. In FIGS. 15A to 15I, it is assumed that the image signal D5 of the second image signal RGB2 corresponds to the second pixel unit AR1' and other image signals A1 to A8, B1 to B8, C1 to C8, D1 to D4, D6 to D8, E1 to E8, F1 to F8, and G1 to F8 correspond to the non-pixel unit AR2 (e.g., see FIG. 7). It is also assumed that the kernel matrix KN includes 6×5 kernel data. The image signal used to generate the compensation image signal C_D corresponding to the second pixel unit AR1' among the second image signals RGB2 is not fixed and may be changed in other embodiments.

Figure 15A:
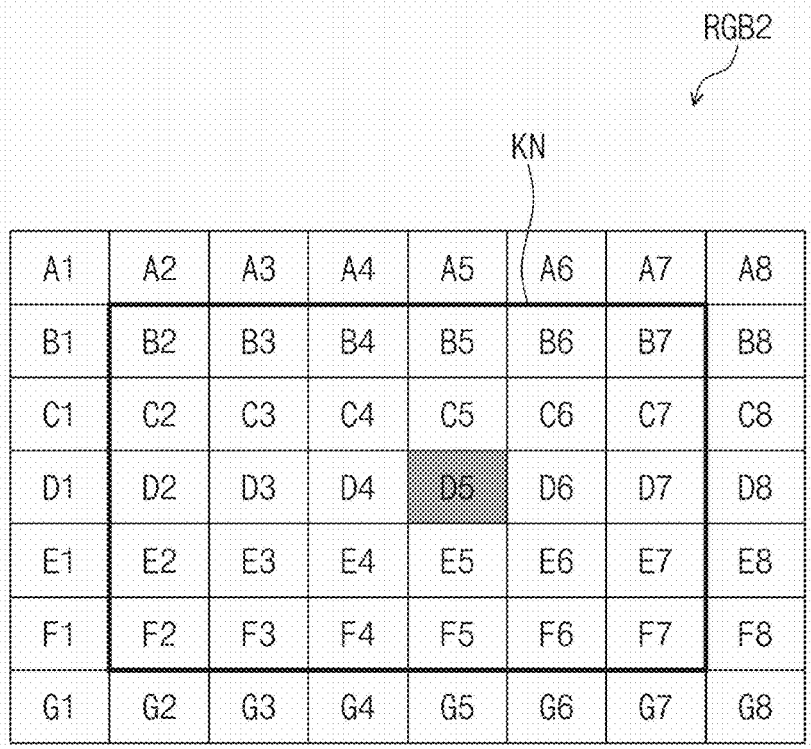

In FIGS. 15A to 15I, the compensator 330 (e.g., see FIG. 12) may generate a compensation image signal C_D corresponding to the second pixel unit AR1' based on the image signals overlapping the kernel matrix KN among the second image signals RGB2. For example, as illustrated in FIG. 15A, the compensator 330 may generate a compensation image signal C_D corresponding to the second pixel unit AR1' based on the image signals B2 to B7, C2 to C7, D1 to D7, E2 to E7, and F2 to F7.

Figure 15B:
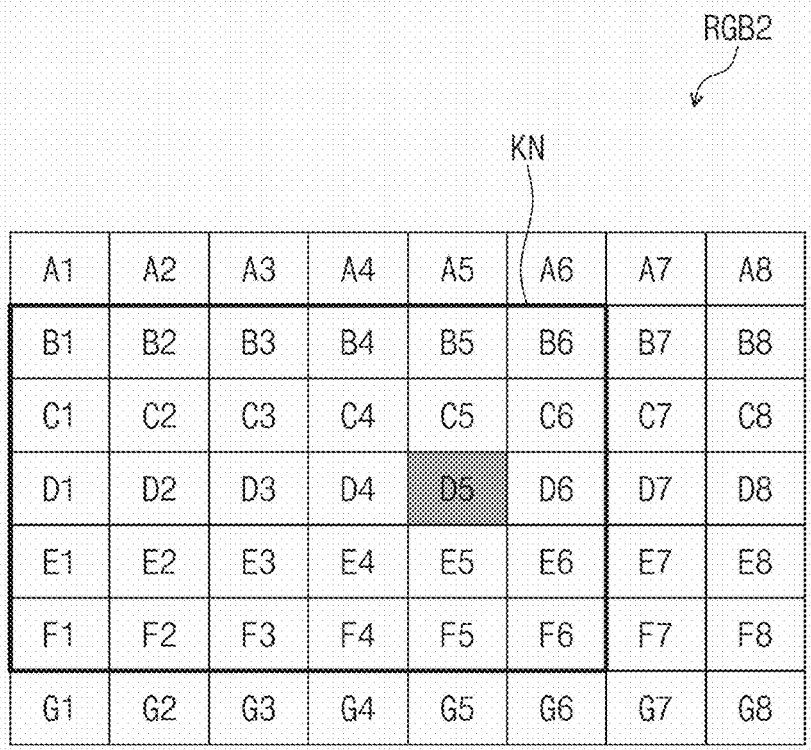

As shown in FIG. 15B, the compensator 330 may generate a compensation image signal C_D corresponding to the second pixel unit AR1' based on the image signals B1 to B6, C1 to C6, D1 to D7, E1 to E6, and F1 to F1.

Figure 15C:
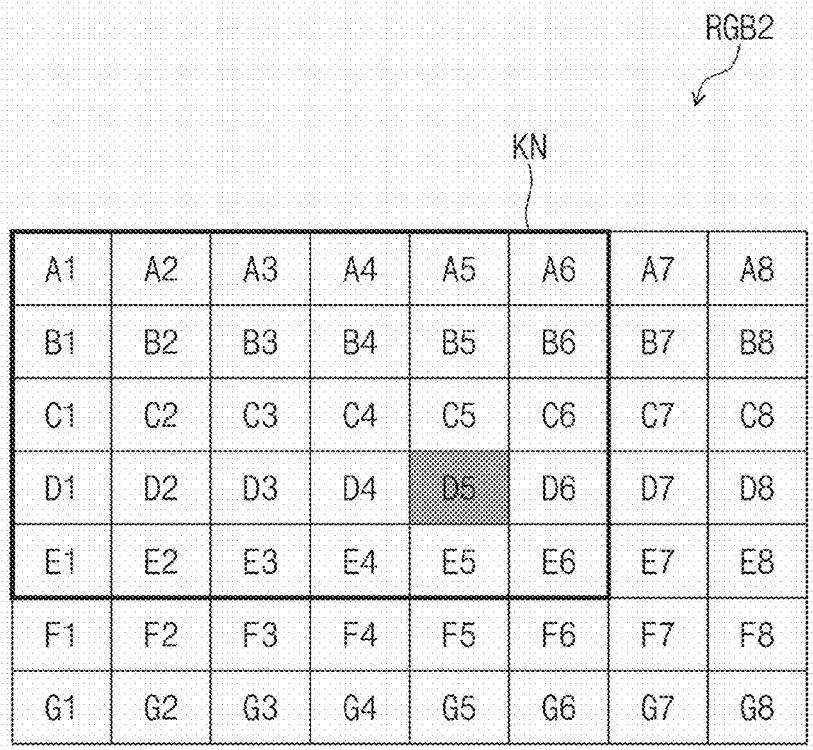

As illustrated in FIG. 15C, the compensator 330 may generate a compensation image signal C_D corresponding to the second pixel unit AR1' based on the image signals A1 to A6, B1 to B6, C1 to C6, D1 to D7, and E1 to E6.

Figure 15D:
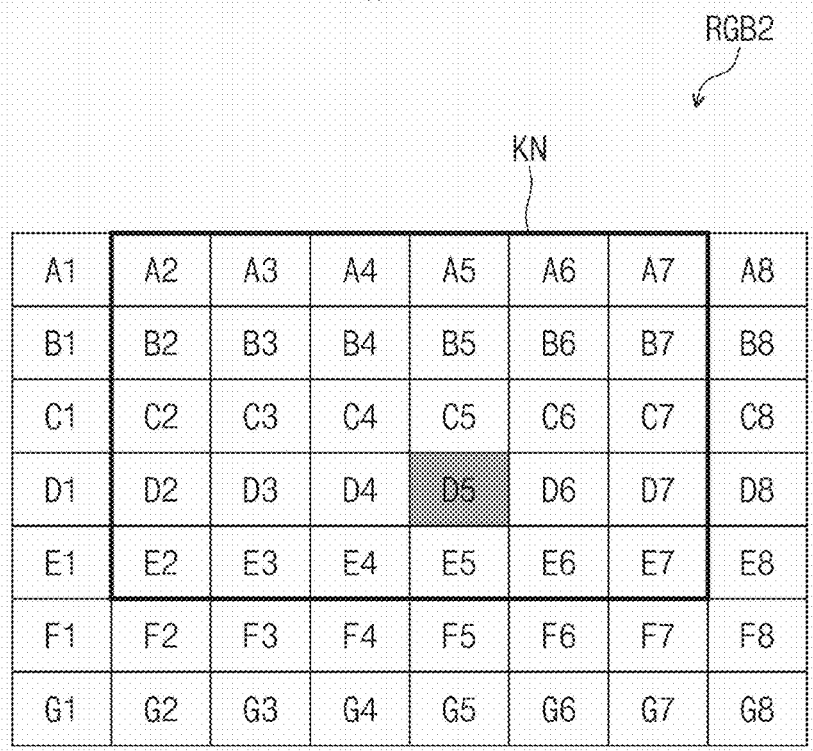

As illustrated in FIG. 15D, the compensator 330 may generate a compensation image signal C_D corresponding to the second pixel unit AR1' based on the image signals A2 to A7, B2 to B7, C2 to C7, D1 to D7, and E2 to E7.

Figure 15E:
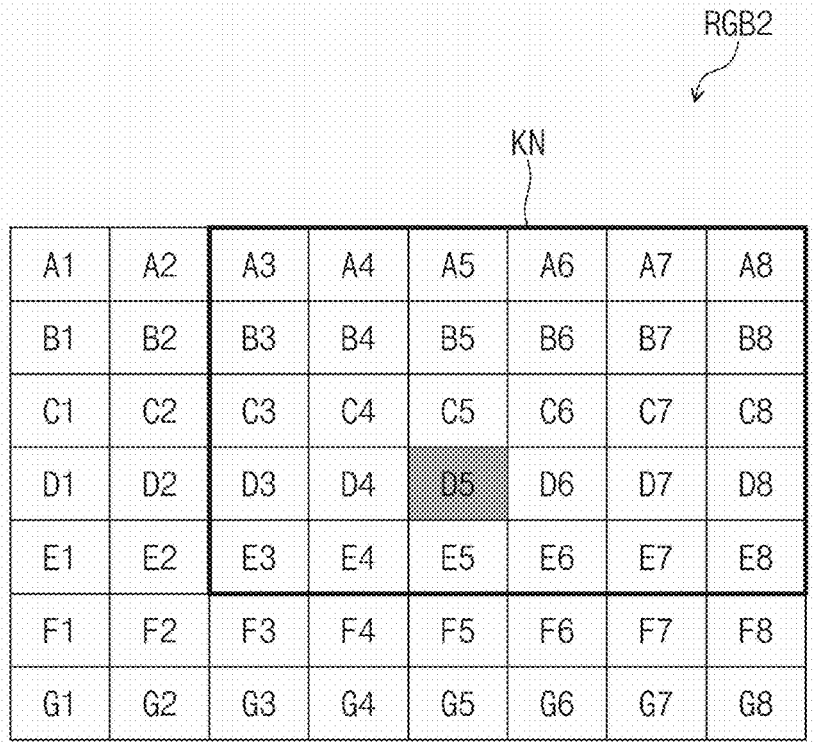

As illustrated in FIG. 15E, the compensator 330 may generate a compensation image signal C_D corresponding to the second pixel unit AR1' based on the image signals A3 to A8, B3 to B8, C3 to C8, D3 to D8, and E3 to E8.

Figure 15F:
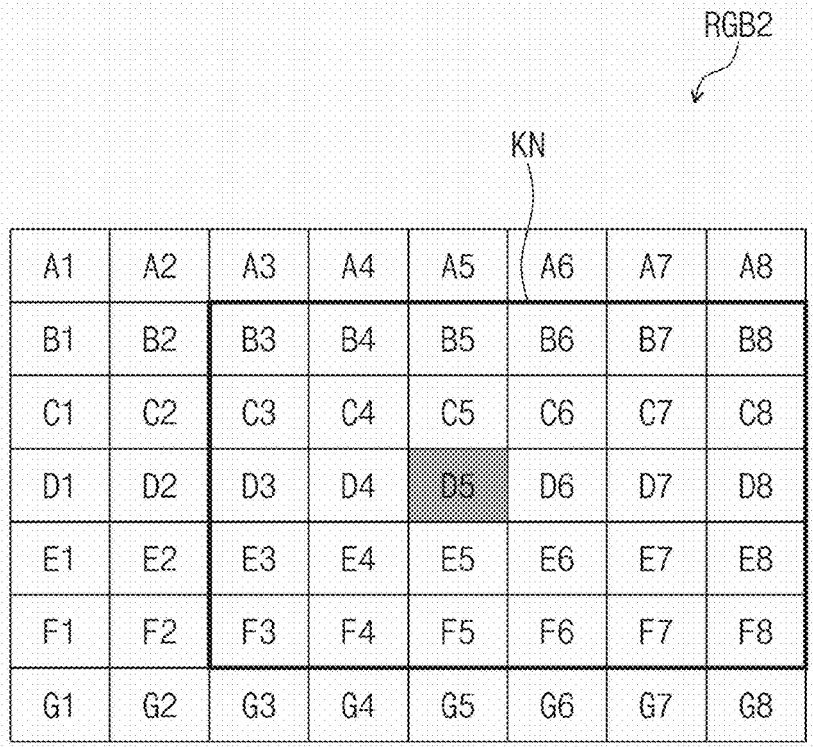

As shown in FIG. 15F, the compensator 330 may generate a compensation image signal C_D corresponding to the second pixel unit AR1' based on the image signals B3 to B8, C3 to C8, D3 to D8, E3 to E8, and F3 to F8.

Figure 15G:
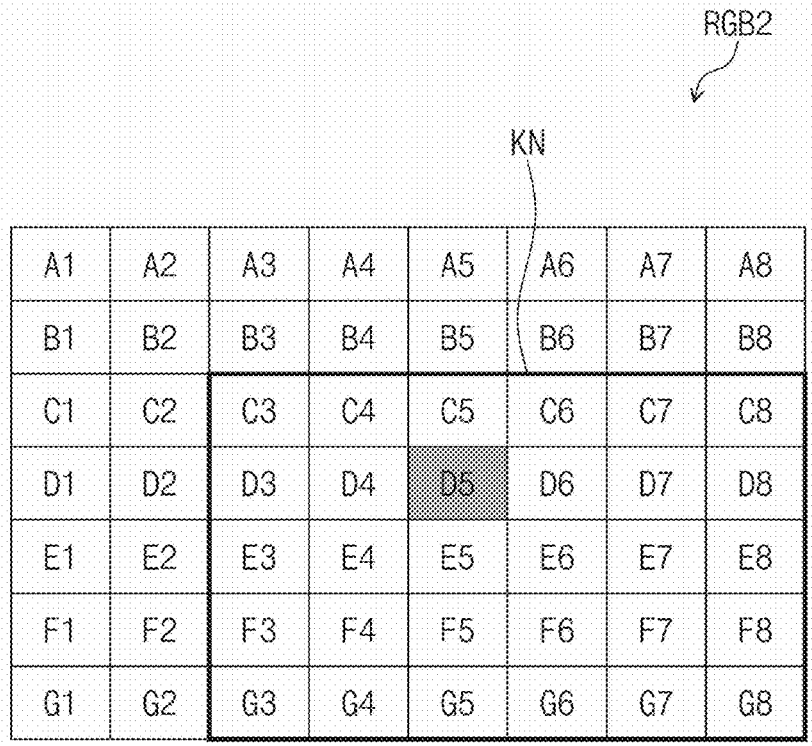

As shown in FIG. 15G, the compensator 330 may generate a compensation image signal C_D corresponding to the second pixel unit AR1' based on the image signals C3 to C8, D3 to D8, E3 to E8, F3 to F8, and G3 to G8.

Figure 15H:
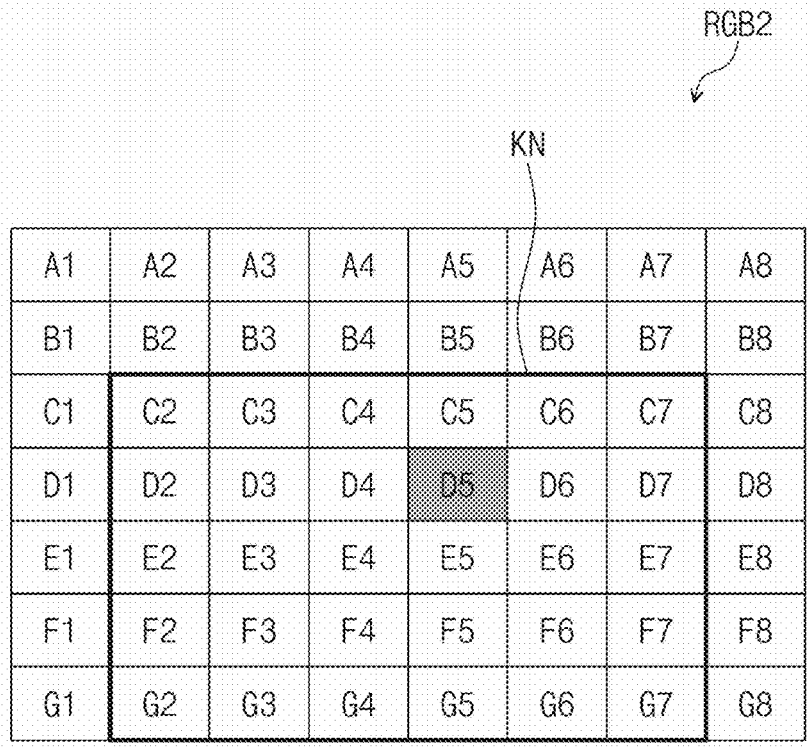

As illustrated in FIG. 15H, the compensator 330 may generate a compensation image signal C_D corresponding to the second pixel unit AR1' based on the image signals C2 to C7, D1 to D7, E2 to E7, F2 to F7, and G2 to G7.

As illustrated in FIG. 15I, the compensator 330 may generate a compensation image signal C_D corresponding to the second pixel unit AR1' based on the image signals C1 to C6, D1 to D7, E1 to E6, F1 to F6, and G1 to G6.

As shown in FIGS. 15A to 15I, the kernel matrix KN may be shifted one-by-one in the clockwise direction based on the image signal D5 to overlap (or correspond to one-to-one) with the second image signal RGB2.

The compensator 330 may sequentially change the image signals calculated with the kernel matrix KN among the second image signals RGB2 for each of a plurality (e.g., every) frame, as shown in FIGS. 15A to 15I. The period in which the compensator 330 changes the image signals calculated with the kernel matrix KN, among the second image signals RGB2, may be changed in various way depending on the embodiment. For example, the positions of image signals calculated with the kernel matrix KN, among the second image signals RGB2, may be changed each interval, for example, which each interval may correspond to a predetermined number of frames, e.g., 30 frames. The order of changing the image signals calculated with the kernel matrix KN, among the second image signals RGB2, is not limited to FIGS. 15A to 15I and may be different in other embodiments.

When a specific pattern, that is, a fixed image (or still image) without motion, is displayed for a long time (e.g., longer than a predetermined time) in the organic light emitting diode display, the fixed image may act as a stress pattern that easily deteriorates the light emitting element ED or the transistor TR (e.g., see FIG. 9). Deterioration of light emitting elements and/or transistors has become a major cause of display quality degradation, which may shorten the lifespan of the display device, for example, by causing spots such as DC afterimages.

By periodically changing the image signals calculated with the kernel matrix KN among the second image signals RGB2, it is possible to prevent or reduce deterioration of the display quality of the second display area DA2.

FIGS. 16A and 16B are diagrams for explaining operation of the compensator shown in FIG. 12 according to one or more embodiments.

Referring to FIGS. 12, 16A and 16B, the compensator 330 may define the second image signal RGB2 output from the memory 320 as a first sub image signal RGBa and a second sub image signal RGBb. The first sub image signal RGBa includes image signals A1 to A6, B1 to B6, C1 to C6, D1 to D6, and E1 to E6 of the second image signal RGB2 as shown in FIG. 15A. The second image signal RGB2 includes image signals A2 to A7, B2 to B7, C2 to C7, D2 to D7, and E2 to E7 of the second image signals RGB2 as shown in FIG. 15A. The compensator 330 generates a third sub image signal RGBc (as shown in FIG. 16B) based on the first sub image signal RGBa and the second sub image signal RGBb. For example, the compensator 330 generates an image signal A12 of the third sub image signal RGBc based on the image signal A1 of the first sub image signal RGBa and the image signal A2 of the second sub image signal RGBb. The compensator 330 may adjust a reflection ratio of the image signal A1 and the image signal A2. As an example, image signal A12 may be calculated based on Equation 1.

$$A12 = \frac{A1 \times 0.65 + A2 \times 0.35}{2} \quad (1)$$

The compensator 330 generates the image signals A12 to A67, B12 to B67, C12 to C67, D12 to D67, and E12 to E67 of the third sub image signal RGBc using Equation 1, based on the image signals A1 to A6, B1 to B6, C1 to C6, D1 to D6, and E1 to E6 of the first sub image signal RGBa and the image signals A2 to A7, B2 to B7, C2 to C7, D2 to D7, and E2 to E7 of the second sub image signal RGBb.

The compensator 330 may perform a convolution operation on the third sub image signal RGBc and the kernel matrix KN illustrated in FIG. 13A, and output a compensation image signal C_D. The second sub-image signal RGBb illustrated in FIG. 16A is an image signal at a position shifted by one pixel from the first sub-image signal RGBa, which is a part of the second image signal RGB2 illustrated in 15A.

If the second sub image signal RGBb is an image shifted by 1/32 pixels from the first sub-image signal RGBa, image signal A12 may be calculated based on Equation 2.

$$A12 = \frac{(A1 \times 31) + (A2 \times 1)}{32} \quad (2)$$

If the second sub-image signal RGBb is an image shifted by 2/32 pixels from the first sub-image signal RGBa, image signal A12 may be calculated based on Equation 3.

$$A12 = \frac{(A1 \times 30) + (A2 \times 2)}{32} \quad (3)$$

If the second sub-image signal RGBb is an image shifted by 3/32 pixels from the first sub-image signal RGBa, the image signal A12 may be calculated based on Equation 4.

$$A12 = \frac{(A1 \times 29) + (A2 \times 3)}{32} \quad (4)$$

If the second sub-image signal RGBb is an image shifted by 31/32 pixels from the first sub-image signal RGBa, the image signal A12 may be calculated based on Equation 5.

$$A12 = \frac{(A1 \times 1) + (A2 \times 31)}{32} \quad (5)$$

As such, the shift distance between the first sub-image signal RGBa and the second sub-image signal RGBb may be different in other embodiments. In addition, a shift period of the second sub-image signal RGBb (e.g., a number of frames to be shifted) may be different in other embodiments. The image signal processing circuit 210 illustrated in FIG. 12 may generate, for example, a second sub image signal RGBb shifted by 1/16 pixels over an interval of frames (e.g., every 60 frames) and may output a compensation image signal C_D.

In accordance with one or more embodiments, a display device may compensate for an image signal to be provided to a pixel in a display panel. The pixel may be disposed in an area overlapping with an electronic module, and the compensation may be performed based on an image signal corresponding to a surrounding pixel in the display panel. Accordingly, even if the number of pixels disposed in an area overlapping the electronic module decreases, it is possible to prevent display quality from deteriorating.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, parts, drivers, transformers, converters, compensators, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, devices, modules, parts, drivers, transformers, converters, compensators, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, parts, drivers, transformers, converters, compensators, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although the embodiments of the present invention have been described, it is understood that the present invention should not be limited to these embodiments but various changes and modifications can be made by one ordinary skilled in the art within the spirit and scope of the present invention as hereinafter claimed. The embodiments may be combined to form additional embodiments.

What is claimed is:

1. A display device, comprising:
a display panel including a first display area having a first light transmittance and a second display area having a second light transmittance higher than the first light transmittance; and
a driving controller configured to receive an image signal and to output a data signal for the display panel,
wherein the image signal comprises a first image signal corresponding to a first pixel unit in the first display area of the display panel and a second image signal corresponding to a second pixel unit and a non-pixel unit adjacent to the second pixel unit in the second display area of the display panel,
wherein the driving controller calculates a compensation signal based on a preset kernel matrix and the second image signal, and outputs a data signal corresponding to the second pixel unit in the second display area based on the compensation signal,
wherein the second pixel unit in the second display area of the display panel comprises:
a base layer;
a circuit element layer disposed on the base layer and including a shielding pattern;
a light emitting element disposed on the circuit element layer; and
an insulating layer disposed on the light emitting element,
wherein the non-pixel unit in the second display area of the display panel comprises the base layer and the insulating layer.

2. The display device of claim 1, further comprising:
an electronic module disposed to overlap with the second display area.

3. The display device of claim 2, wherein the electronic module is a camera.

4. The display device of claim 1, wherein:
the first display area includes a first number of first pixel units per unit area, and
the second display area includes a second number of second pixel units per unit area, the second number being less than the first number.

5. The display device of claim 1, wherein the driving controller comprises:
a compensator configured to calculate the compensation signal; and
mapping logic configured to map the compensation signal to the second pixel unit in the second display area to generate the data signal.

6. The display device of claim 5, wherein the driving controller comprises:
a gamma converter configured to convert the image signal to a gamma image signal; and
a memory configured to store the gamma image signal and to output:
the first image signal corresponding to the first pixel unit in the first display area, and
the second image signal corresponding to the second pixel unit and the non-pixel unit in the second display area.

7. The display device of claim 6, wherein the driving controller further comprises a gamma inverse transformer configured to convert a signal output from the mapping logic to the data signal.

8. The display device of claim 5, wherein the kernel matrix comprises a×b number of kernel data, where a and b are natural numbers.

9. The display device of claim 8, wherein the compensator is configured to calculate a×b number of the second image signals corresponding to the second pixel unit and the non-pixel unit with a×b number of the kernel data.

10. The display device of claim 9, wherein a×b number of the kernel data is in one-to-one correspondence with a×b number of the second image signal.

11. The display device of claim 10, wherein the second image signal corresponding to a×b number of the kernel data is changed at each of a plurality of preset periods.

12. The display device of claim 5, wherein the compensator is configured to:
define the second image signal as:
a first sub image signal corresponding to the image signal that corresponds to the second pixel unit and the image signal that corresponds to the non-pixel unit, and
a second sub image signal derived from the first sub image signal,
generate a third sub image signal based on the first sub image signal and the second sub image signal, and
calculate the third sub image signal and the kernel matrix to output the compensation signal.

13. A display device, comprising:
a display panel including a first display area having a first light transmittance and a second display area having a second light transmittance higher than the first light transmittance; and
a driving controller configured to receive an image signal and to output a data signal for the display panel,
wherein the image signal comprises a first image signal corresponding to a first pixel unit in the first display area of the display panel and an image signal corresponding to a second pixel unit and an image signal corresponding to a non-pixel unit adjacent to the second pixel unit in the second display area of the display panel,
wherein the driving controller calculates a compensation signal based on a preset kernel matrix, the image signal corresponding to the second pixel unit and the image signal corresponding to the non-pixel unit, and outputs the data signal corresponding to the second pixel unit in the second display area based on the compensation signal,
wherein the second pixel unit in the second display area of the display panel comprises a plurality of light emitting areas spaced apart from each other and emitting a light, and
wherein the non-pixel unit in the second display area of the display panel comprises a transmission area without emitting a light.

14. The display device of claim 13, further comprising:
an electronic module disposed to overlap with the second display area.

15. The display device of claim 14, wherein the electronic module is a camera.

16. A display device, comprising:
an electronic module;

a display panel including a first display area non-overlapping the electronic module and a second display area overlapping the electronic module and adjacent to the first display area; and
a driving controller configured to receive an image signal and to output a data signal to be provided to the display panel, wherein the driving controller is configured to:
divide the image signal into a first image signal corresponding to a first pixel unit in the first display area of the display panel and a second image signal corresponding to a second pixel unit and a non-pixel unit adjacent to the second pixel unit in the second display area of the display panel, calculate a compensation signal based on a preset kernel matrix and the second image signal, the second image signal including an image signal corresponding to the second pixel unit and an image signal corresponding to the non-pixel unit, and output a data signal corresponding to the second pixel unit in the second display area based on the compensation signal, wherein the second pixel unit in the second display area of the display panel comprises:
a base layer;
a circuit element layer disposed on the base layer and including a shielding pattern;
a light emitting element disposed on the circuit element layer; and
an insulating layer disposed on the light emitting element, and
wherein the non-pixel unit in the second display area of the display panel comprises the base layer and the insulating layer.

17. The display device of claim 16, wherein the driving controller comprises:
a compensator configured to calculate the compensation signal; and
mapping logic configured to map the compensation signal to the second pixel unit in the second display area to generate the data signal.

18. The display device of claim 17, wherein the kernel matrix comprises:
a×b number of kernel data (a and b are natural numbers) in one-to-one correspondence with a×b number of the second image signals.

19. The display device of claim 18, wherein the compensator calculates a×b number of the second image signals corresponding to the second pixel unit and the non-pixel unit with a×b number of the kernel data.

* * * * *